(12) United States Patent
Iida et al.

(10) Patent No.: US 11,079,539 B2
(45) Date of Patent: Aug. 3, 2021

(54) SEMICONDUCTOR DEVICE AND MANUFACTURING METHOD OF THE SAME

(71) Applicant: RENESAS ELECTRONICS CORPORATION, Tokyo (JP)

(72) Inventors: Tetsuya Iida, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 28 days.

(21) Appl. No.: 16/370,409

(22) Filed: Mar. 29, 2019

(65) Prior Publication Data

US 2019/0317276 A1 Oct. 17, 2019

(30) Foreign Application Priority Data

Apr. 16, 2018 (JP) .............................. JP2018-078162

(51) Int. Cl.

| | |
|---|---|
| *G02B 6/12* | (2006.01) |
| *H01S 5/02345* | (2021.01) |
| *H01L 31/12* | (2006.01) |
| *H01L 31/0232* | (2014.01) |
| *H01L 31/18* | (2006.01) |
| *H01S 5/02326* | (2021.01) |
| *H01S 5/02* | (2006.01) |
| *H01S 5/026* | (2006.01) |
| *H01S 5/40* | (2006.01) |
| *H01S 5/02375* | (2021.01) |

(Continued)

(52) U.S. Cl.
CPC .... *G02B 6/12004* (2013.01); *H01L 31/02005* (2013.01); *H01L 31/02327* (2013.01); *H01L 31/12* (2013.01); *H01L 31/186* (2013.01); *H01S 5/02345* (2021.01); *G02B 2006/12061* (2013.01); *G02B 2006/12121* (2013.01); *G02B 2006/12123* (2013.01)

(58) Field of Classification Search
CPC ............................ H01S 5/02252; H01S 5/021
See application file for complete search history.

(56) References Cited

U.S. PATENT DOCUMENTS

| | | | |
|---|---|---|---|
| 5,621,837 A | 4/1997 | Yamada et al. | |
| 9,817,197 B2 * | 11/2017 | Kinghorn | ............ G02B 6/4238 |
| 2016/0252688 A1 | 9/2016 | Barwicz et al. | |

FOREIGN PATENT DOCUMENTS

| | | |
|---|---|---|
| JP | 08-78657 A | 3/1996 |
| WO | 2015/111600 A1 | 7/2015 |

* cited by examiner

*Primary Examiner* — Ryan A Lepisto
*Assistant Examiner* — Erin D Chiem
(74) *Attorney, Agent, or Firm* — McDermott Will & Emery LLP

(57) ABSTRACT

According to the present invention, a first semiconductor chip includes a semiconductor substrate, an optical waveguide formed on an upper surface of the semiconductor substrate, and a concave portion formed in the semiconductor substrate in a region that differs from a region in which the optical waveguide is formed. A second semiconductor chip includes a compound semiconductor substrate, and a light emitting unit formed on an upper surface of the compound semiconductor substrate and emitting a laser beam. The second semiconductor chip is mounted in the concave portion of the first semiconductor chip, and a pedestal which is an insulating film is formed between a bottom surface of the concave portion and a back surface of the compound semiconductor substrate.

11 Claims, 18 Drawing Sheets

(51) Int. Cl.
*H01S 5/042* (2006.01)
*H01S 5/028* (2006.01)
*H01L 31/02* (2006.01)

CROSS SECTION ALONG A-A

CROSS SECTION ALONG B-B

CROSS SECTION ALONG A-A

CROSS SECTION ALONG B-B

CROSS SECTION ALONG A-A

CROSS SECTION ALONG B-B

CROSS SECTION ALONG A-A

CROSS SECTION ALONG B-B

US 11,079,539 B2

SEMICONDUCTOR DEVICE AND MANUFACTURING METHOD OF THE SAME

CROSS-REFERENCE TO RELATED APPLICATION

The present application claims priority from Japanese Patent Application No. 2018-78162 filed on Apr. 16, 2018, the content of which is hereby incorporated by reference into this application.

TECHNICAL FIELD OF THE INVENTION

The present invention relates to a semiconductor device and a manufacturing method of this semiconductor device which can be used for, for example, a semiconductor device that includes an optical device and a manufacturing method of this semiconductor device.

BACKGROUND OF THE INVENTION

A technique known as silicon photonics has been developed in recent years for semiconductor devices that perform optical communication. In this silicon photonics technique, an optical signal transmission line made of silicon, germanium or the like is formed on a semiconductor substrate, and a photonic chip integrating various optical devices and electronic devices formed by the optical signal transmission line is used. In addition, a laser diode chip serving as a light emitting source, an optical fiber and the like are mounted on this photonic chip to achieve a semiconductor device serving as an optical communication module.

Japanese Patent Application Laid-Open Publication No. H08-78657 (Patent Document 1) discloses a technique in which a laser diode chip and an electronic circuit chip are mounted on a semiconductor substrate of a photonic chip.

International Patent Publication No. WO2015/111600 (Patent Document 2) and United States Patent Application Publication No. 2016-0252688 (Patent Document 3) discloses a technique in which a portion of a semiconductor substrate of a photonic chip is processed to form a pedestal, and a laser diode chip is mounted on the pedestal.

SUMMARY OF THE INVENTION

In order to enhance performance of the silicon photonics technique, it is important that a laser beam emitted from the laser diode chip is accurately incident on an optical waveguide in the silicon photonic chip.

Other problems and novel features will be apparent from the description in the present specification and the attached drawings.

According to an embodiment of the present invention, a semiconductor device comprises: a first semiconductor chip that includes a first substrate, an optical waveguide formed on an upper surface of the first substrate, and a concave portion formed in the first substrate; and a second semiconductor chip that includes a second substrate, and a light emitting unit formed on an upper surface of the second substrate and emitting a light toward the optical waveguide. Here, the second semiconductor chip is mounted in the concave portion of the first semiconductor chip, and a pedestal which is an insulating film is formed between a bottom surface of the concave portion and a back surface of the second substrate.

According to the embodiment of the present invention, performance of the semiconductor device can be enhanced.

DESCRIPTION OF THE PREFERRED EMBODIMENTS

Figure 1:
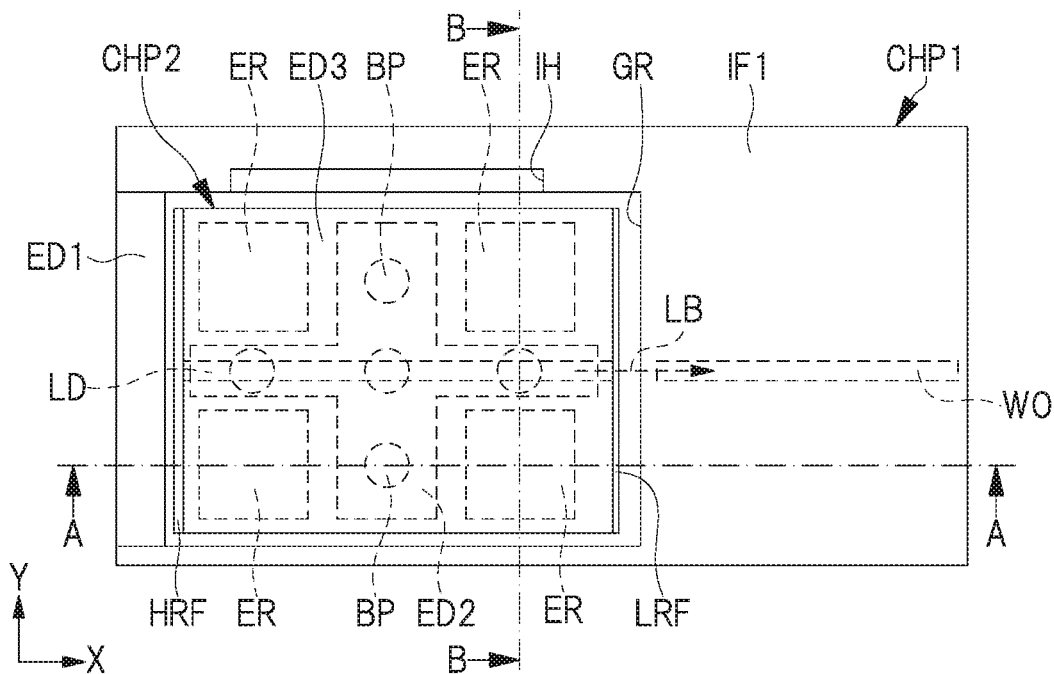
FIG. 1 is a plan view showing a semiconductor device which is a semiconductor module according to a first embodiment.

In the embodiment described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification, detailed or supplementary description or the like. In addition, in the embodiment described below, when referring to the number of a component (including number of pieces, numerical value, amount and range), the number is not limited to a specified number and may be less than or greater than this number unless otherwise clearly specified or unless it is obvious from the context that the number is limited to the specified number in principle. Furthermore, in the embodiment described below, it goes without saying that each component (including an element step) is not indispensable unless otherwise clearly specified or unless it is obvious from the context that the component is indispensable in principle. Likewise, in the embodiment described below, when referring to a shape, a positional relation or the like of a component, a substantially approximate shape, a similar shape or the like is included unless otherwise clearly specified or unless it is obvious from the context that the shape, the positional relation or the like of the component differs in principle. The same applies to the above-described numerical value and range.

Hereinafter, an embodiment of the present invention will be described in detail with reference to the drawings. Note that, in all of the drawings used to describe the embodiment, members having the same function are denoted by the same reference signs, and redundant descriptions thereof are omitted as appropriate. In addition, in the embodiment described below, descriptions of the same or similar portions are generally not repeated unless otherwise necessary.

Further, in the drawings used to describe the embodiment, hatched lines and the like are occasionally omitted for the sake of clarity. For example, even if the drawing includes a closed concave portion in plan view, contour lines of its background may be omitted in cross-sectional view if it is obvious from the description or the like.

First Embodiment

Figure 2:
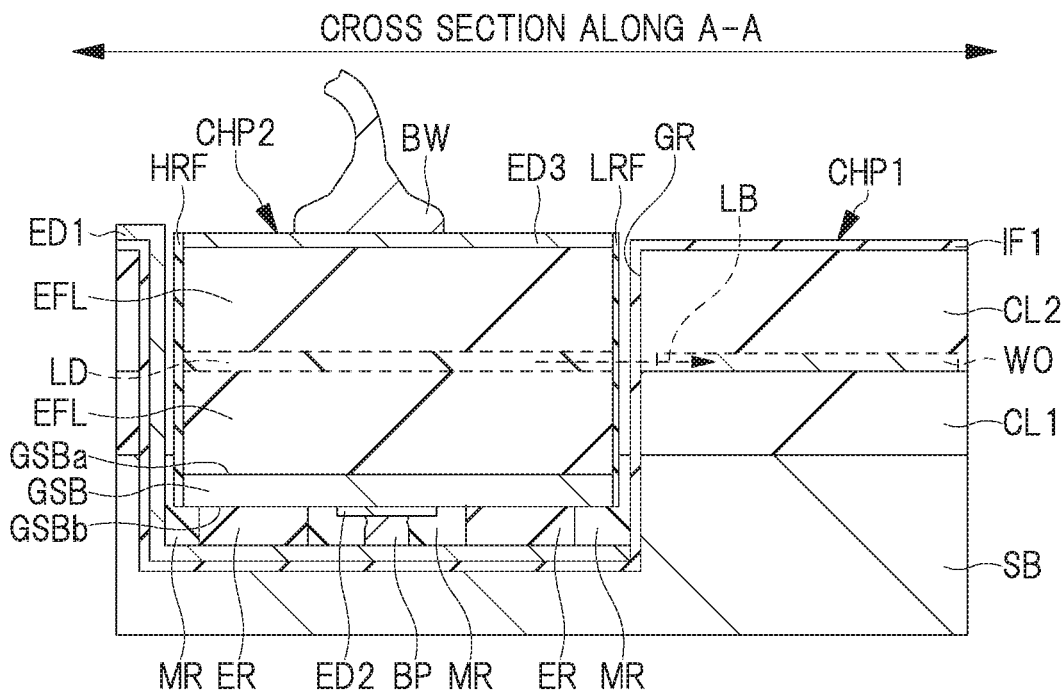
FIG. 2 is a cross-sectional view showing the semiconductor device which is the semiconductor module according to the first embodiment.
Figure 3:
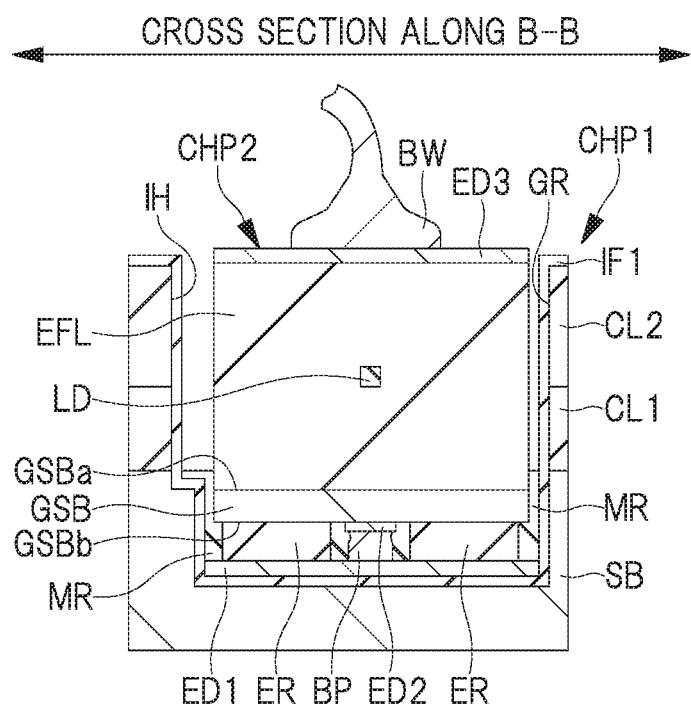
FIG. 3 is a cross-sectional view showing the semiconductor device which is the semiconductor module according to the first embodiment.

A semiconductor device shown in FIGS. 1 to 3 is a semiconductor module comprising a semiconductor chip CHP1 which is a photonic chip that includes an optical waveguide WO, and a semiconductor chip CHP2 which is a laser diode chip that includes a light emitting unit LD serving as a light emitting source.

Figure 27:
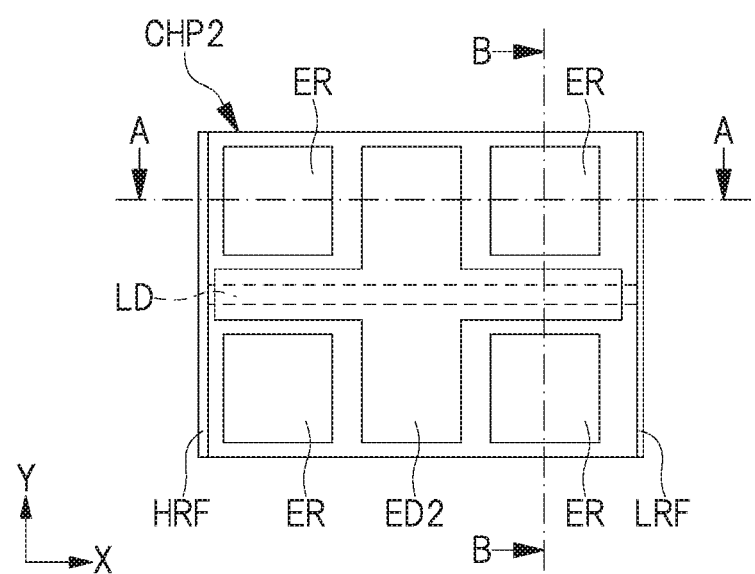
FIG. 27 is a plan view showing the laser diode chip according to the first embodiment.

FIG. 1 is a plan view of the semiconductor device. FIG. 2 is a cross-sectional view taken along a line A-A of FIG. 1, and FIG. 3 is a cross-sectional view taken along a line B-B of FIG. 1. In FIG. 1, an illustration of a bonding wire BW is omitted, and the optical waveguide WO of the semiconductor chip CHP1, the light emitting unit LD of the semiconductor chip CHP2, an electrode ED2, pedestals ER and bump electrodes BP are indicated by broken lines. In FIG. 2, the optical waveguide WO of the semiconductor chip CHP1 and the light emitting unit LD of the semiconductor chip CHP2 are indicated by broken lines. In addition, FIG. 27 is a plan view (bottom view) corresponding to a surface of the semiconductor chip CHP2 opposite to the surface shown in FIG. 1.

Structure of Semiconductor Chip CHP1 (Photonic Chip)

Hereinafter, the semiconductor chip CHP1 partially configuring the semiconductor device of the present embodiment will be described.

The semiconductor chip CHP1 comprises the optical waveguide WO which is an optical signal transmission line, a light modulator that converts an electric signal into an optical signal, a photoelectric converter that converts an optical signal into an electric signal, and the like. Here, features of the present embodiment are only associated with a peripheral structure of the semiconductor chip CHP2 of the semiconductor device, and thus, descriptions of other structures such as the photoelectric converter, the light modulator and the like will be omitted. Regarding the photoelectric converter, the light modulator and the like, a known configuration adopted in, for example, the silicon photonics technique can be applied.

As shown in FIGS. 2 and 3, an SOI (Silicon on Insulator) substrate is used in the semiconductor chip CHP1. The SOI substrate includes a semiconductor substrate (substrate) SB, an insulating layer CL1 formed over an upper surface of the semiconductor substrate SB, and a semiconductor layer SL formed over the upper surface of the semiconductor substrate SB via the insulating layer CL1. The semiconductor substrate SB is made of, for example, a p-type silicon single crystal substrate. The semiconductor substrate SB may be a two-layer substrate that includes a semiconductor layer formed over an insulating (sapphire) layer that functions as a support substrate, such as an SOS (Silicon on Sapphire) substrate. The insulating layer CL1 is, for example, a silicon oxide film and has a thickness of approximately 2 μm to 3 μm. The semiconductor layer SL is a p-type silicon layer and has a thickness of approximately 180 nm to 250 nm.

The semiconductor layer SL is selectively patterned, and a plurality of semiconductor layers SL are present over the insulating layer CL1. In the present embodiment, only the semiconductor layer SL which becomes the optical waveguide WO is shown. An interlayer insulating film CL2 is formed over the insulating layer CL1 so as to cover the optical waveguide WO. Namely, the interlayer insulating film CL2 is formed so as to be in contact with upper and side surfaces of the optical waveguide WO. The interlayer insulating film CL2 is, for example, a silicon oxide film and has a thickness of approximately 2 μm to 3 μm.

In the silicon photonics technique, the optical waveguide WO functions as a core layer, and the insulating layer CL1 and the interlayer insulating film CL2 function as a cladding layer. As shown in FIG. 1, in the present embodiment, the optical waveguide WO extends in an X direction and includes two end surfaces in the X direction. One of the two end surfaces is an incident surface of a laser beam LB. The optical waveguide WO includes at least one portion located on a line extended from the light emitting unit LD of the semiconductor chip CHP2. This portion of the optical waveguide WO includes a light receiving surface facing the light emitting unit LD of the semiconductor chip CHP2. The light receiving surface of the optical waveguide WO is formed so as to face an exit surface of the semiconductor chip CHP2.

Note that the present embodiment has described a case where only one optical waveguide WO is formed in the semiconductor chip CHP1 by way of example. However, a plurality of optical waveguides WO may instead be formed in the semiconductor chip CHP1.

A concave portion GR penetrating the interlayer insulating film CL2 and the insulating layer CL1 and reaching into the semiconductor substrate SB is formed in a region of the semiconductor chip CHP1 that differs from a region in which the optical waveguide WO is formed. The concave portion GR is mainly provided as a region for mounting the semiconductor chip CHP2 which is a laser diode chip. Planar dimensions of the concave portion GR in FIG. 1 are designed so as to accommodate the semiconductor chip CHP2 and are such that, for example, a length in a Y direction is greater than 150 μm and a length in the X direction is greater than 250 μm. In the present embodiment, the Y direction is a direction that is orthogonal to the X direction in plan view.

Although the end surface of the optical waveguide WO that is closer to the concave portion GR becomes the incident surface of the laser beam LB, the interlayer insulating film CL2 is present between the concave portion GR and the incident surface of the optical waveguide WO. However, the thickness of the interlayer insulating film CL2 present in this region is, for example, approximately 100 nm to 1000 nm, whereby the laser beam LB can reach the incident surface of the optical waveguide WO.

In addition, a bottom surface of the concave portion GR is substantially flat, and unevennesses serving as a pedestal for placing the semiconductor chip CHP2 in the concave portion GR are not formed. Therefore, an upper surface of each of an insulating film IF1 and an electrode ED1 described below is also substantially flat at the bottom surface of the concave portion GR.

As shown in FIGS. 1 and 3, an injection hole IH is formed in a portion of the side surface of the concave portion GR. The injection hole IH is mainly provided for injecting a sealing material MR described below into the concave portion GR. Thus, the injection hole IH is formed such that a bottom surface of the injection hole IH is located, for example, at a position approximately 3 μm to 6 μm higher than the bottom surface of the concave portion GR. Note that the injection hole IH does not need to be provided in a case where the sealing material MR can be sufficiently injected into the concave portion GR.

The insulating film IF1 is formed over the bottom and side surfaces of the concave portion GR and over the interlayer insulating film CL2. The insulating film IF1 is, for example, a silicon oxide film or a silicon nitride film and has a thickness of, for example, approximately 50 nm to 100 nm. The insulating film IF1 is mainly provided for the purpose of preventing damage to the light emitting unit LD of the semiconductor chip CHP2 at the time of mounting the semiconductor chip CHP2.

The electrode ED1 is formed on the bottom surface of the concave portion GR and on the side surface of the concave portion GR that is opposite to the side surface closer to the optical waveguide WO. The electrode ED1 is constituted by a metal film made of chromium (Cr) or the like and a conductive film made of copper (Cu) or the like formed over the metal film. The electrode ED1 is provided for the purpose of being electrically connected to the electrode ED2 which is a backside electrode of the semiconductor chip CHP2 to supply a potential from the outside to the electrode ED2.

Structure of Semiconductor Chip CHP2 (Laser Diode Chip)

Hereinafter, the semiconductor chip CHP2 partially configuring the semiconductor device of the present embodiment will be described with reference to FIGS. 1 to 3 and FIG. 27 which is a plan view (bottom view) of the opposite side of the plan view of the semiconductor chip CHP2 of FIG. 1.

As shown in FIGS. 2 and 3, in the semiconductor chip CHP2, a compound semiconductor substrate (substrate) GSB that includes an upper surface GSBa and a back surface GSBb which is a surface opposite to the upper surface GSBa is used as a support substrate. The compound semiconductor substrate GSB is made of a compound semiconductor such as a gallium arsenide (GaAs) or the like. A plurality of compound semiconductor layers such as $Ga_{1-x}Al_xAs$ layers are formed over the upper surface GSBa of the compound semiconductor substrate GSB, and these compound semiconductor layers configure element forming layers EFL. In addition, some of the element forming layers EFL are $Ga_{1-y}Al_yAs$ layers (Y>X) and configure an active layer which is the light emitting unit LD of the laser beam (light) LB, while the other element forming layers EFL configure a cladding layer.

Note that the present embodiment has described a case where the compound semiconductor substrate (substrate) GSB and the element forming layers EFL are based on gallium arsenide (GaAs) by way of example. However, the compound semiconductor substrate GSB and the element forming layers EFL may instead be based on other compound semiconductors such as indium phosphide (InP) or the like.

Note that the present embodiment has also described a case where only one light emitting unit LD is formed in the semiconductor chip CHP2 by way of example. However, a plurality of light emitting units LD may instead be formed in the semiconductor chip CHP2.

An electrode ED3 which is an upper electrode of the semiconductor chip CHP2 is formed above the light emitting unit LD, that is, on the element forming layer EFL. The electrode ED3 is a metal film containing, for example, gold (Au), nickel (Ni) or copper (Cu).

The electrode ED2 which is a lower electrode of the semiconductor chip CHP2 is formed on the back surface GSBb of the compound semiconductor substrate GSB. The electrode ED2 is constituted by a metal film containing, for example, gold (Au), nickel (Ni) or copper (Cu), and an alloy film made of metal contained in the metal film and material contained in the compound semiconductor substrate GSB.

Note that the material configuring the semiconductor chip CHP2 is not limited to the above-described materials as long as the semiconductor chip CHP2 can function as a laser diode chip.

As shown in FIGS. 1, 2 and 27, a low reflection film LRF and a high reflection film HRF are formed over the two side surfaces of the semiconductor chip CHP2 that are perpendicular to an extending direction of the light emitting unit LD. The high reflection film HRF plays a role in reflecting most of the laser beam LB generated in the light emitting unit LD and is a film having a higher reflectance than the low reflection film LRF. The low reflection film LRF plays a role in transmitting a portion of the laser beam LB generated in the light emitting unit LD to the outside of the semiconductor chip CHP2 and is a film having a lower reflectance than the high reflection film HRF. Thus, as shown in FIGS. 1 and 2, the laser beam LB is emitted from the light emitting unit LD of the semiconductor chip CHP2 via the low reflection film LRF, further passes through the insulating film IF1 and the interlayer insulating film CL2 of the semiconductor chip CHP1 and reaches into the optical waveguide WO.

Namely, as shown in FIG. 1, the light emitting unit LD extends in the X direction and includes two end surfaces in the X direction. The end surface on which the low reflection film LRF is formed becomes the exit surface of the laser beam LB, and the end surface on which the high reflection film HRF is formed becomes a reflecting surface of the laser beam LB.

In addition, the low reflection film LRF is a single layer film constituted by, for example, a silicon nitride film, a silicon oxynitride film or an aluminum oxide film. The high reflection film HRF is a stacked film constituted by, for example, a silicon nitride film, a silicon oxynitride film, a silicon oxide film or an aluminum oxide film, and has a thickness that is greater than the low reflection film LRF. Note that the material and the thicknesses of the low reflection film LRF and high reflection film HRF can be changed accordingly within the range in which the respective roles can be achieved.

In addition, the low reflection film LRF and the high reflection film HRF also play a role in protecting each of the end surfaces of the light emitting unit LD at the time of mounting the semiconductor chip CHP2 on the semiconductor chip CHP1.

As shown in FIGS. 1 to 3 and 27, a plurality of pedestals ER are formed on the back surface GSBb of the compound semiconductor substrate GSB. The plurality of pedestals ER are adhesive photosensitive resin films and are adhered to the compound semiconductor substrate GSB. The pedestals ER are provided for precisely aligning a position of the light emitting unit LD of the semiconductor chip CHP2 and a position of the optical waveguide WO of the semiconductor chip CHP1 with each other at the time of mounting the semiconductor chip CHP2 on the semiconductor chip CHP1.

It is preferable that three or more pedestals ER are provided for the purpose of stably mounting the semiconductor chip CHP2 on the semiconductor chip CHP1, and in the present embodiment, a case where four pedestals ER are provided is described by way of example. In addition, when virtual lines connecting the centers of the four pedestals ER in plan view are drawn, it is preferable that a quadrangular shape is formed by these virtual lines. Namely, when three or more pedestals ER are provided and virtual lines connecting the centers of the pedestals ER in plan view are drawn, it is preferable that a polygonal shape is formed by these virtual lines. In other words, when three or more pedestals ER are arranged in a straight line and the virtual lines connecting the centers of the pedestals ER form a straight line in plan view, the semiconductor chip CHP2 would not be stably mounted on the semiconductor chip CHP1, causing an increase in the possibility of the semiconductor chip CHP2 collapsing. However, depending on the shape and size of the pedestals ER, the plurality of pedestals ER may be arranged in a straight line.

For the same purpose, as shown in FIGS. 1 and 27, one or more pedestals ER are arranged at positions closer to one of the two sides of the semiconductor chip CHP2 opposite to each other in the Y direction in plan view, and one or more pedestals ER are arranged at positions closer to the other of the two sides in plan view. For example, a state in which no pedestal ER is arranged at a position closer to the other of the two sides of the semiconductor chip CHP2 is not preferred since it increases the possibility of the semiconductor chip CHP2 collapsing.

Namely, in plan view of the semiconductor chip CHP2, one or more pedestals ER are arranged at positions closer to one of the two sides opposite to each other in the Y direction than to a first center line connecting center points of the two sides opposite to each other in the X direction, and one or more pedestals ER are arranged at positions closer to the other of the two sides than to the first center line. From the same viewpoint, in plan view of the semiconductor chip CHP2, one or more pedestal ER are arranged at positions closer to one of the two sides opposite to each other in the X direction than to a second center line connecting center points of the two sides opposite to each other in the Y direction, and one or more pedestals ER are arranged at positions closer to the other of the two sides than to the second center line.

In addition, in a case where a planar shape of each of the pedestals ER is a quadrangle as in the present embodiment, planar dimensions of each of the pedestals ER are such that a length in the X direction is approximately 20 µm to 50 µm and a length in the Y direction is 20 µm to 50 µm. Further, a height of each of the pedestals ER is approximately 5 µm to 10 µm.

In addition, the pedestal ER is an insulating film and is more preferably an adhesive photosensitive resin film. As will be described in detail below, such a resin film is formed on the basis of a permanent resist film ER0. The permanent resist film ER0 is used in MEMS (micro-electro-mechanical systems) utilized for pressure sensors and the like and has a sufficiently high adhesive strength and hardness as compared to a resist film used in ion implantation and dry etching processes or the like during a front-end manufacturing process. Therefore, in the present embodiment, the permanent resist film ER0 can be sufficiently applied as a member of the pedestal ER for aligning the light emitting unit LD and the optical waveguide WO with each other.

Structure of Semiconductor Module Including Semiconductor Chip CHP1 and Semiconductor Chip CHP2

As shown in FIGS. 1 to 3, the semiconductor chip CHP2 is mounted in the concave portion GR of the semiconductor chip CHP1 to configure the semiconductor module which is one form of the semiconductor device of the present embodiment.

The bump electrode BP constituted by a conductive film made of solder or the like is formed on the electrode ED1 formed on the bottom surface of the concave portion GR of the semiconductor chip CHP1. The electrode ED1 of the semiconductor chip CHP1 and the electrode ED2 of the semiconductor chip CHP2 are electrically connected via the bump electrode BP. Note that the bump electrode BP is provided at a position not overlapping the pedestal ER in plan view. Namely, since the pedestal ER is an insulating film, the semiconductor chip CHP1 and the semiconductor chip CHP2 are electrically connected by the conductive bump electrode BP.

In addition, a bonding wire BW is connected to the electrode ED3 of the semiconductor chip CHP2. The bonding wire BW and the electrode ED1 allow a potential to be supplied to the semiconductor chip CHP2 to flow a current in the semiconductor chip CHP2.

The plurality of pedestals ER of the semiconductor chip CHP2 are arranged so as to be in contact with the electrode ED1 in the concave portion GR. Here, the semiconductor chip CHP2 includes the light emitting unit LD that emits light toward the optical waveguide WO of the semiconductor chip CHP1. In addition, the position of the light emitting unit LD of the semiconductor chip CHP2 and the position of the optical waveguide WO of the semiconductor chip CHP1 can be precisely aligned by mainly adjusting the thickness of the pedestal ER. As will be described in detail below, forming the pedestal ER by the insulating film constituted by the permanent resist film ER0 allows the position of the light emitting unit LD of the semiconductor chip CHP2 to be easily aligned with the position of the optical waveguide WO of the semiconductor chip CHP1. Therefore, as shown in FIGS. 1 and 2, the end surface (exit surface) of the light emitting unit LD of the semiconductor chip CHP1 faces the end surface (incident surface) of the optical waveguide WO of the semiconductor chip CHP2.

In addition, the pedestal ER is located between the bottom surface of the concave portion GR and the back surface GSBb of the compound semiconductor substrate GSB, and has a sufficient hardness to support the semiconductor chip CHP2. For example, the prior art document provides a structure corresponding to the pedestal ER formed by etching a portion of the semiconductor substrate SB of the semiconductor chip CHP1. However, the pedestal ER made of a resin film in the present embodiment also has a hardness equivalent to that of the prior art document.

The sealing material MR is formed in the concave portion GR such that a region through which the laser beam LB passes is not blocked. Namely, the sealing material MR is formed in the concave portion GR in a region that differs from a region connecting the light emitting unit LD and the optical waveguide WO to each other. The sealing material MR is a resin film in which, for example, a silica filler is added to epoxy resin, and is a thermosetting resin film. As shown in FIGS. 2 and 3, the sealing material MR of the present embodiment is filled up to the vicinity of a boundary between the insulating layer CL1 and the semiconductor substrate SB. The sealing material MR is formed mainly for the purpose of fixing the semiconductor chip CHP2 in the concave portion GR. The sealing material MR is filled in the concave portion GR so as to be in contact with at least a portion of the pedestal ER and be located at a lower position than the optical waveguide WO and the light emitting unit LD.

Hereinafter, manufacturing methods of the semiconductor device of the present embodiment will be described. Here, a manufacturing method of the semiconductor chip CHP1, a manufacturing method of the semiconductor chip CHP2, and a manufacturing method of the semiconductor module in which the semiconductor chip CHP2 is mounted on the semiconductor chip CHP1 will be described in this order.

Manufacturing Method of Semiconductor Chip CHP1

Figure 4:
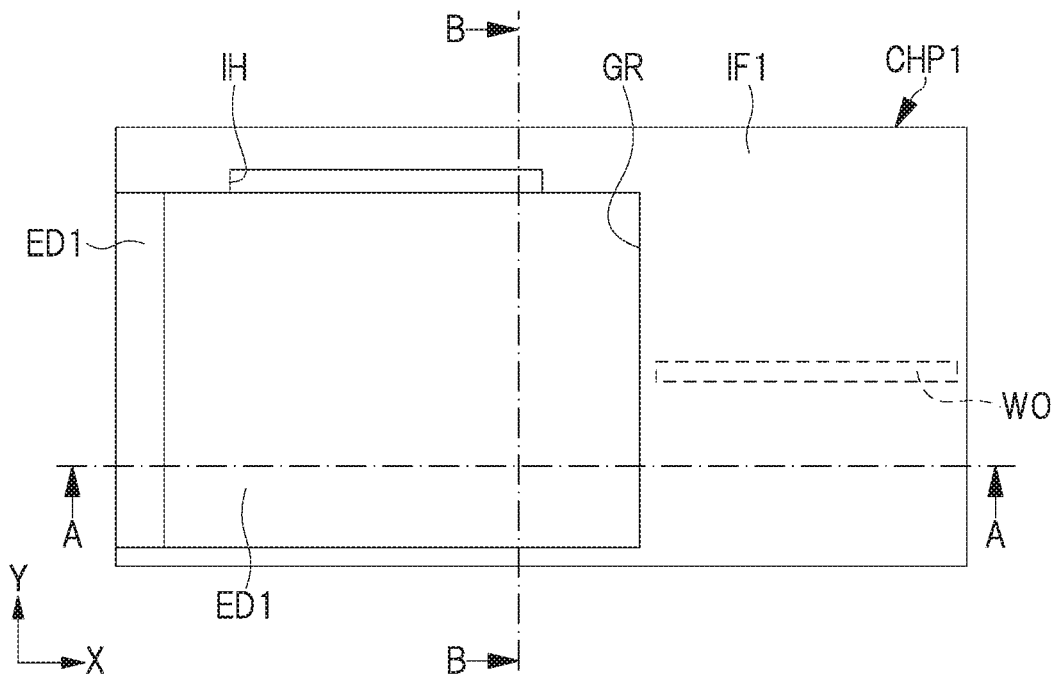
FIG. 4 is a plan view showing a photonic chip according to the first embodiment.

Hereinafter, a manufacturing method of the semiconductor chip CHP1 partially configuring the semiconductor device according to the present embodiment will be described with reference to FIGS. 4 to 11. FIG. 4 is a plan view showing the semiconductor chip CHP1 from which the semiconductor chip CHP2 shown in the plan view of FIG. 1 is removed. FIGS. 5, 7, 9, 11, 13, 15 and 17 show cross-sectional views taken along the line A-A of FIG. 4. FIGS. 6, 8, 10, 12, 14, 16 and 18 show cross-sectional views taken along the line B-B of FIG. 4.

Figure 5:
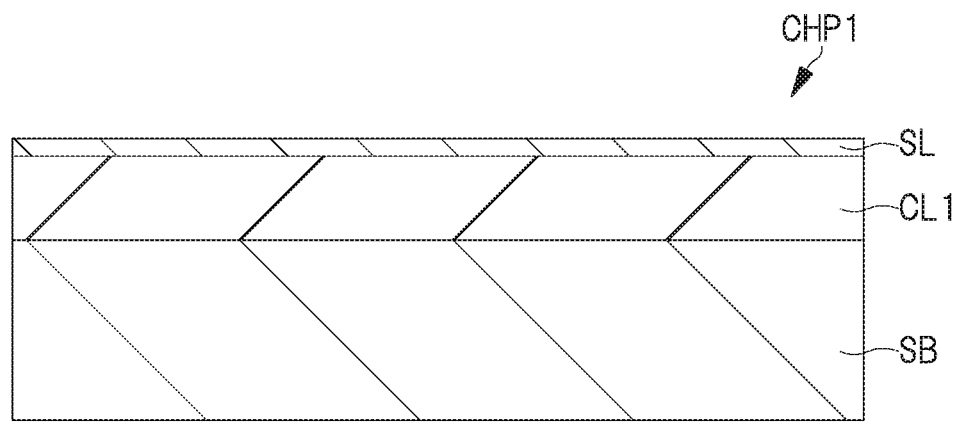
FIG. 5 is a cross-sectional view showing the photonic chip according to the first embodiment in a manufacturing process.
Figure 6:
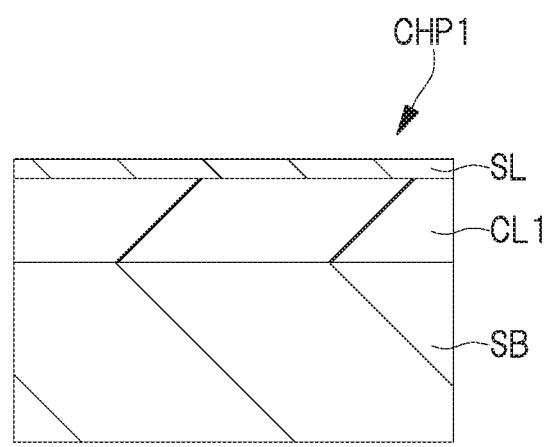
FIG. 6 is a cross-sectional view showing the photonic chip according to the first embodiment in the manufacturing process.

First, as shown in FIGS. 5 and 6, the SOI substrate is prepared. The SOI substrate comprises the semiconductor substrate SB which is a support substrate, the insulating layer CL1 formed over the semiconductor substrate SB, and the semiconductor layer SL formed over the semiconductor substrate SB with the insulating layer CL1 interposed therebetween.

Hereinafter, an example of the step of preparing such an SOI substrate will be described. The SOI substrate can be formed by, for example, the adhesion method. In the adhesion method, after the insulating layer CL1 is formed by oxidizing a surface of a first semiconductor substrate made of silicon, a second semiconductor substrate made of silicon is pressure bonded to the insulating layer CL1 at a high temperature to be adhered thereto. Thereafter, a thickness of the second semiconductor substrate is reduced. In this case, the thin film of the second semiconductor substrate remaining on the insulating layer CL1 becomes the semiconductor layer SL, and the first semiconductor substrate below the insulating layer CL1 becomes the semiconductor substrate SB.

Figure 7:
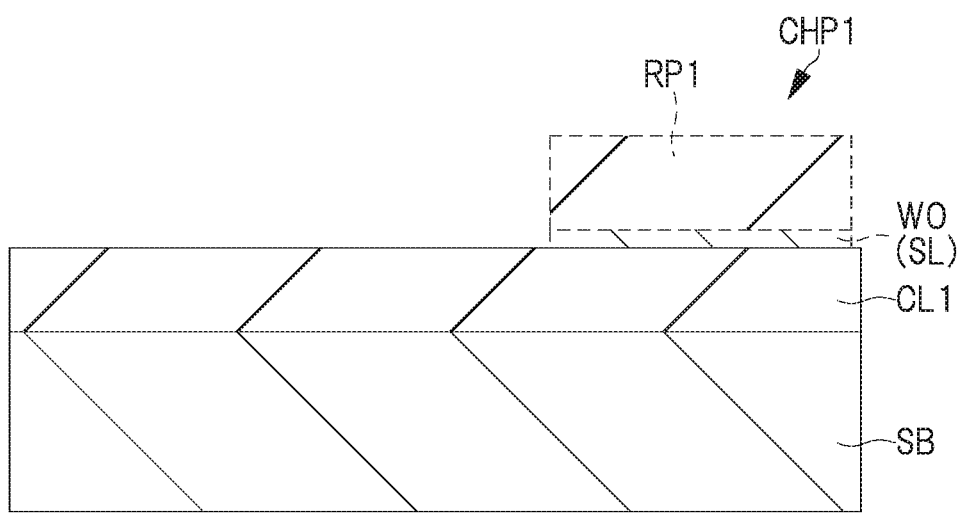
FIG. 7 is a cross-sectional view showing the photonic chip according to the first embodiment in the manufacturing process continued from FIG. 5.
Figure 8:
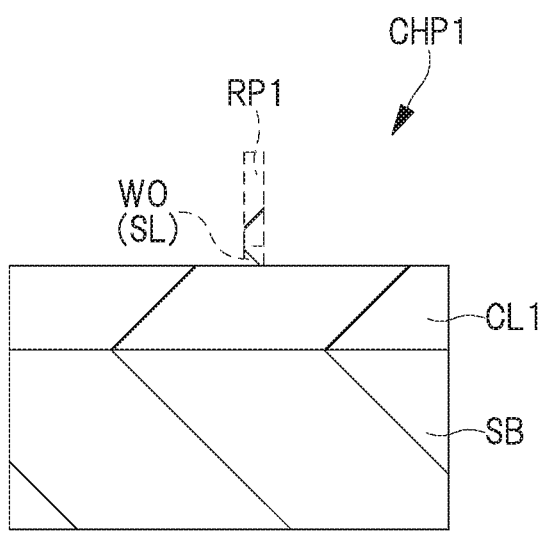
FIG. 8 is a cross-sectional view showing the photonic chip according to the first embodiment in the manufacturing process continued from FIG. 6.

FIGS. 7 and 8 show a step of forming the optical waveguide WO.

First, impurities such as boron, boron fluoride or the like are implanted into the semiconductor layer SL by the photolithography technique and the ion implantation method. Next, a resist pattern RP1 is formed on the semiconductor layer SL so as to selectively cover the semiconductor layer SL. Next, the semiconductor layer SL is selectively patterned by performing the dry etching process with using the resist pattern RP1 as a mask to form the optical waveguide WO. Thereafter, the resist pattern RP1 is removed by the asking process. In the present embodiment, ion implantation is performed on the semiconductor layer SL prior to patterning the semiconductor layer SL. However, this order may be reversed as needed.

In the cross section along A-A shown in FIG. 7 and the cross section along B-B shown in FIG. 8, the optical waveguide WO is indicated by broken lines in order to facilitate understanding of the invention, although the semiconductor layer SL is actually removed and the optical waveguide WO is not formed. Namely, in the cross section along A-A shown in FIG. 7 and the cross section along B-B shown in FIG. 8, the optical waveguide WO formed in a direction of a drawing plane is indicated by broken lines. The same applies to the cross section along A-A and the cross section along B-B shown in the other drawings.

Figure 9:
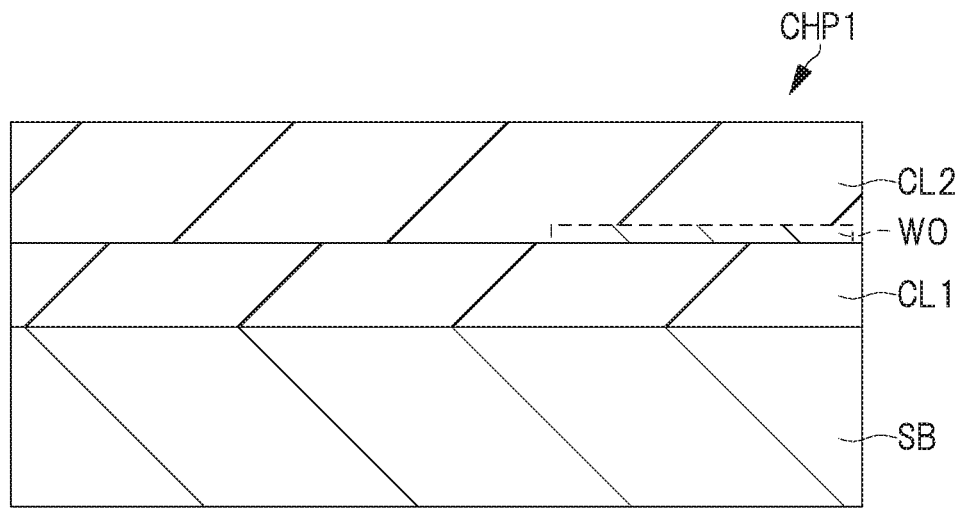
FIG. 9 is a cross-sectional view showing the photonic chip according to the first embodiment in the manufacturing process continued from FIG. 7.
Figure 10:
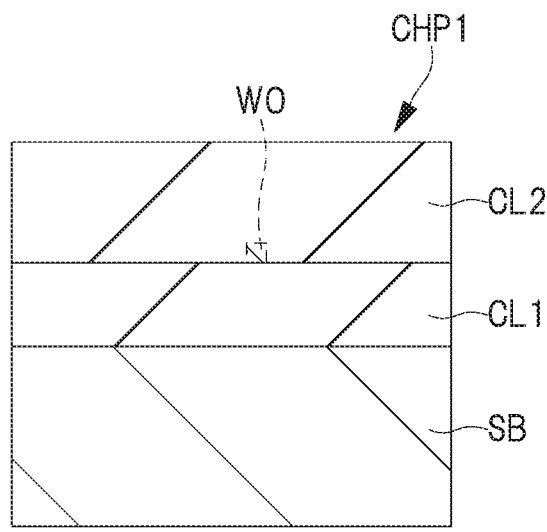
FIG. 10 is a cross-sectional view showing the photonic chip according to the first embodiment in the manufacturing process continued from FIG. 8.

FIGS. 9 and 10 show a step of forming the interlayer insulating film CL2.

First, the interlayer insulating film CL2 made of, for example, silicon oxide is formed over the optical waveguide WO and the insulating layer CL1 by, for example, the CVD (Chemical Vapor Deposition) process. Next, the interlayer insulating film CL2 is polished by the CMP (Chemical Mechanical Polishing) method to planarize an upper surface of the interlayer insulating film CL2. The interlayer insulating film CL2 is formed so as to cover the optical waveguide WO and configures a cladding layer together with the insulating layer CL1.

A plurality of wiring layers and a plurality of interlayer insulating films are actually formed over the optical waveguide WO. However, in the present embodiment, these layers will be referred to as the interlayer insulating film CL2, and detailed descriptions thereof will be omitted.

Figure 11:
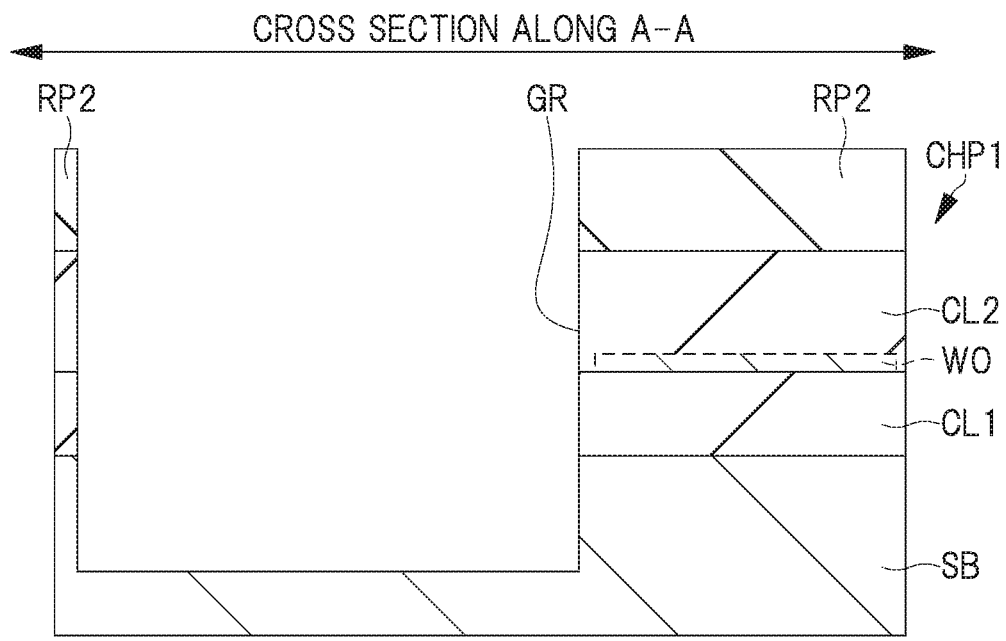
FIG. 11 is a cross-sectional view showing the photonic chip according to the first embodiment in the manufacturing process continued from FIG. 9.
Figure 12:
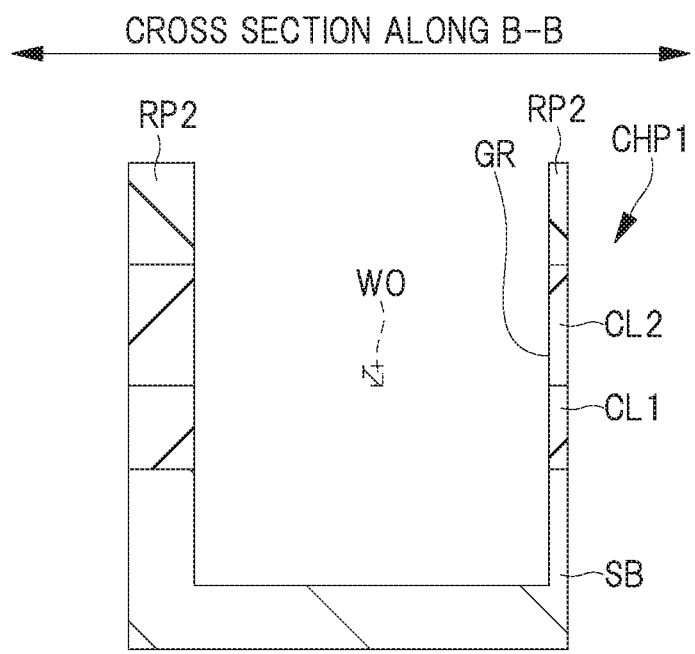
FIG. 12 is a cross-sectional view showing the photonic chip according to the first embodiment in the manufacturing process continued from FIG. 10.

FIGS. 11 and 12 show a step of forming the concave portion GR.

First, a resist pattern RP2 is formed on the interlayer insulating film CL2 so as to selectively cover the interlayer insulating film CL2. Next, the interlayer insulating film CL2, the insulating layer CL1 and the semiconductor substrate SB are sequentially etched by performing the dry etching process with using the resist pattern RP2 as a mask to form the concave portion GR. Thereafter, the resist pattern RP2 is removed by the ashing process.

As shown in the cross section along A-A, a small amount of the interlayer insulating film CL2 remains beside the optical waveguide WO in the step of forming the concave portion GR in order to suppress damage to the light receiving surface of the optical waveguide WO during the dry etching process. The thickness of the remaining interlayer insulating film CL2 may be as thin enough to allow the laser beam LB shown in FIG. 1 to pass therethrough, and is, for example, approximately 100 nm to 1000 nm.

Figure 13:
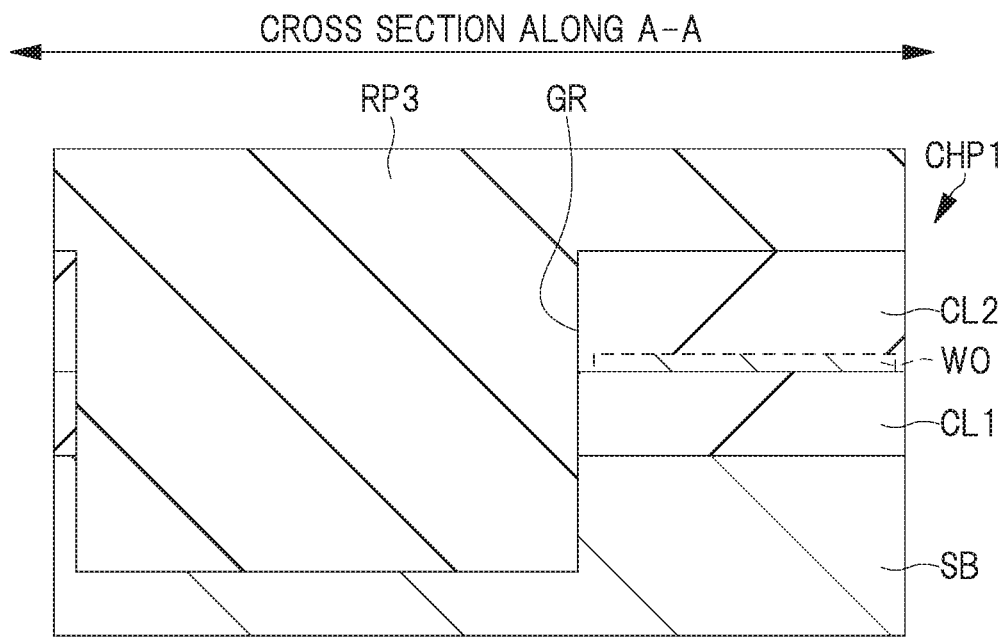
FIG. 13 is a cross-sectional view showing the photonic chip according to the first embodiment in the manufacturing process continued from FIG. 11.
Figure 14:
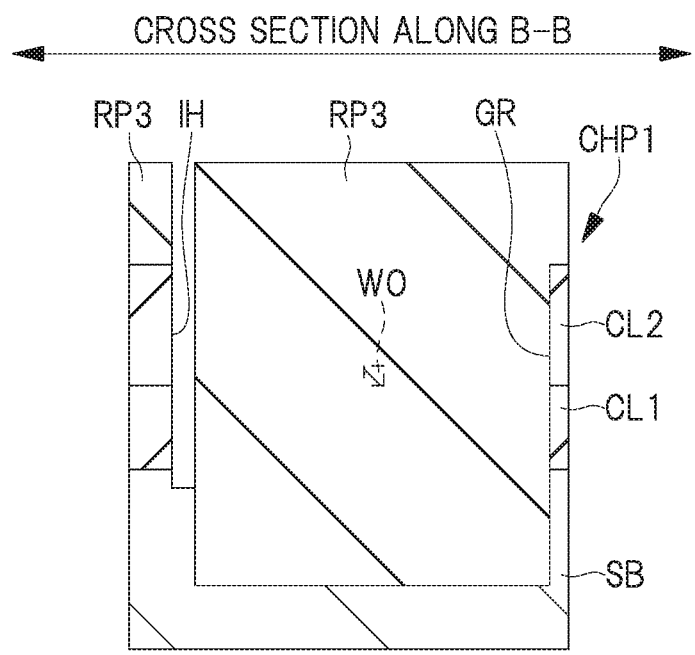
FIG. 14 is a cross-sectional view showing the photonic chip according to the first embodiment in the manufacturing process continued from FIG. 12.

FIGS. 13 and 14 show a step of forming the injection hole IH.

First, a resist pattern RP3 is formed over the interlayer insulating film CL2 so as to fill most of the concave portion GR. Next, the interlayer insulating film CL2 and the insulating layer CL1 are sequentially etched by performing the dry etching process with using the resist pattern RP3 as a mask to form the injection hole IH. During this etching process, a portion of the semiconductor substrate SB below the insulating layer CL1 may also be etched such that the bottom surface of the injection hole IH is adjusted to be located at a position approximately 3 μm to 6 μm higher than the bottom surface of the concave portion GR. The injection hole IH is formed in the side surface of the concave portion GR and is integral with the concave portion GR. Thereafter, the resist pattern RP3 is removed by the ashing process.

Note that the step of forming the injection hole IH is not always necessary. The injection hole IH may not need to be formed in a case where the sealing material MR can be sufficiently injected into the concave portion GR in any subsequent step.

Figure 15:
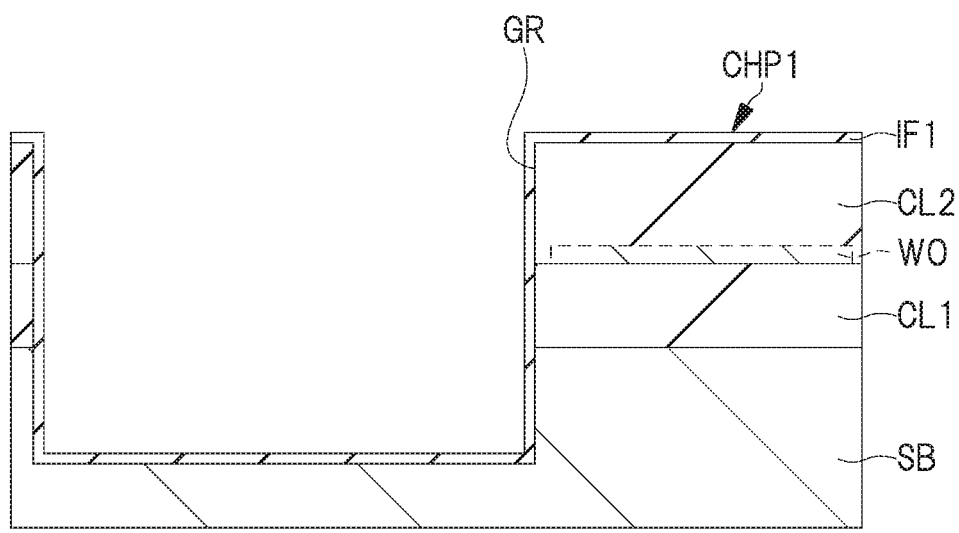
FIG. 15 is a cross-sectional view showing the photonic chip according to the first embodiment in the manufacturing process continued from FIG. 13.
Figure 16:
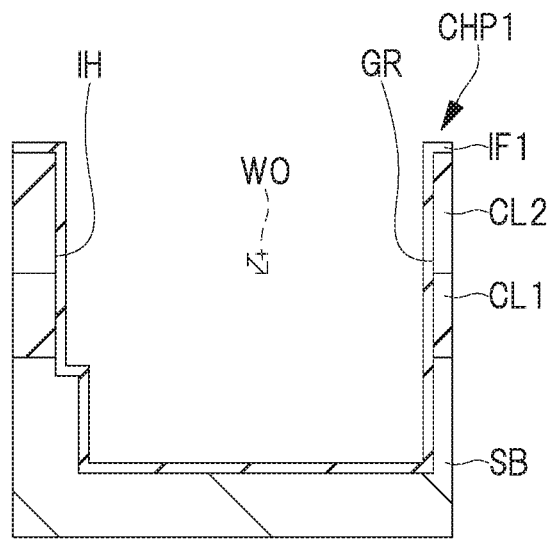
FIG. 16 is a cross-sectional view showing the photonic chip according to the first embodiment in the manufacturing process continued from FIG. 14.

FIGS. 15 and 16 show a step of forming the insulating film IF1.

The insulating film IF1 is formed over the interlayer insulating film CL2 and over the side and bottom surfaces of the concave portion GR by, for example, the CVD (Chemical Vapor Deposition) process. The insulating film IF1 is, for example, a silicon oxide film or a silicon nitride film and has a thickness of approximately 50 nm to 100 nm. The insulating film IF1 may be as thin enough to allow the laser beam LB shown in FIG. 1 to pass therethrough.

Figure 17:
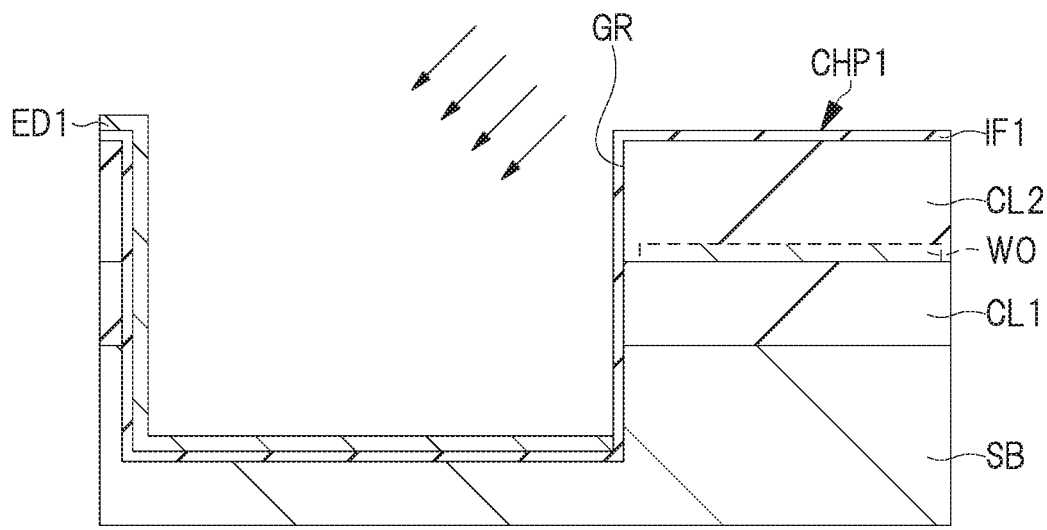
FIG. 17 is a cross-sectional view showing the photonic chip according to the first embodiment in the manufacturing process continued from FIG. 15.
Figure 18:
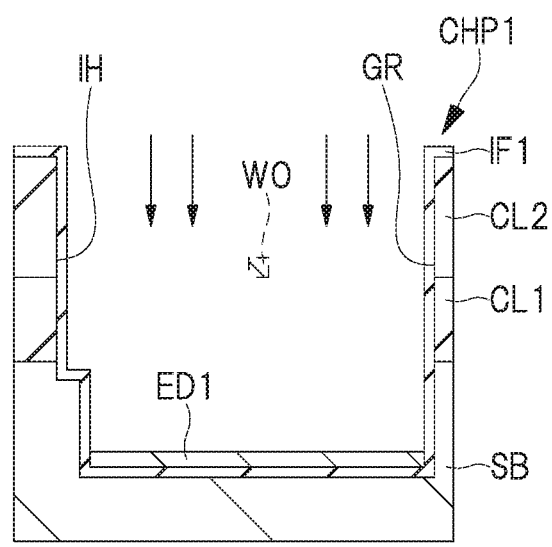
FIG. 18 is a cross-sectional view showing the photonic chip according to the first embodiment in the manufacturing process continued from FIG. 16.

FIGS. 17 and 18 show a step of forming the electrode ED1.

First, a metal film made of chromium (Cr) or the like is formed over the bottom surface of the concave portion GR and over the side surface of the concave portion GR opposite to the side surface closer to the optical waveguide WO by the sputtering method, and then, a seed layer made of copper (Cu) is formed over this metal film by the sputtering method. The sputtering method is performed in a direction indicated by arrows in FIG. 17. Namely, in the cross section along A-A shown in FIG. 17, the sputtering method is performed by tilting the semiconductor substrate SB such that the arrows in FIG. 17 are set along a vertical direction. Thus, the metal film and the seed layer can be selectively formed over the bottom surface of the concave portion GR and the side surface of the concave portion GR opposite to the side surface closer to the optical waveguide WO.

Next, a copper film is formed over the seed layer by the plating method. Thus, the seed layer becomes integral with the copper film to form the electrode ED1 constituted by the metal film and the copper film.

Thereafter, a back surface of the semiconductor substrate SB is polished as necessary, and the semiconductor substrate SB is singulated in a step of dicing to form a plurality of semiconductor chips CHP1.

In this manner, the semiconductor chip CHP1 partially configuring the semiconductor device of the present embodiment is manufactured.

Note that singulation of the semiconductor substrate SB may be performed after the semiconductor chip CHP2 is mounted on the semiconductor chip CHP1. Thus, manufacturing costs of the semiconductor device can be reduced.

Manufacturing Method of Semiconductor Chip CHP2

Hereinafter, a manufacturing method of the semiconductor chip CHP2 partially configuring the semiconductor device according to the present embodiment will be described with reference to FIGS. 19 to 27.

First, a wafer WF is prepared. The wafer WF comprises the compound semiconductor substrate GSB that includes the upper surface GSBa and the back surface GSBb, the element forming layer EFL formed over the upper surface GSBa of the compound semiconductor substrate GSB, the light emitting unit LD formed in the element forming layer EFL, the electrode ED3 formed on the element forming layer EFL, and the electrode ED2 formed on the back surface GSBb of the compound semiconductor substrate GSB.

Figure 19:
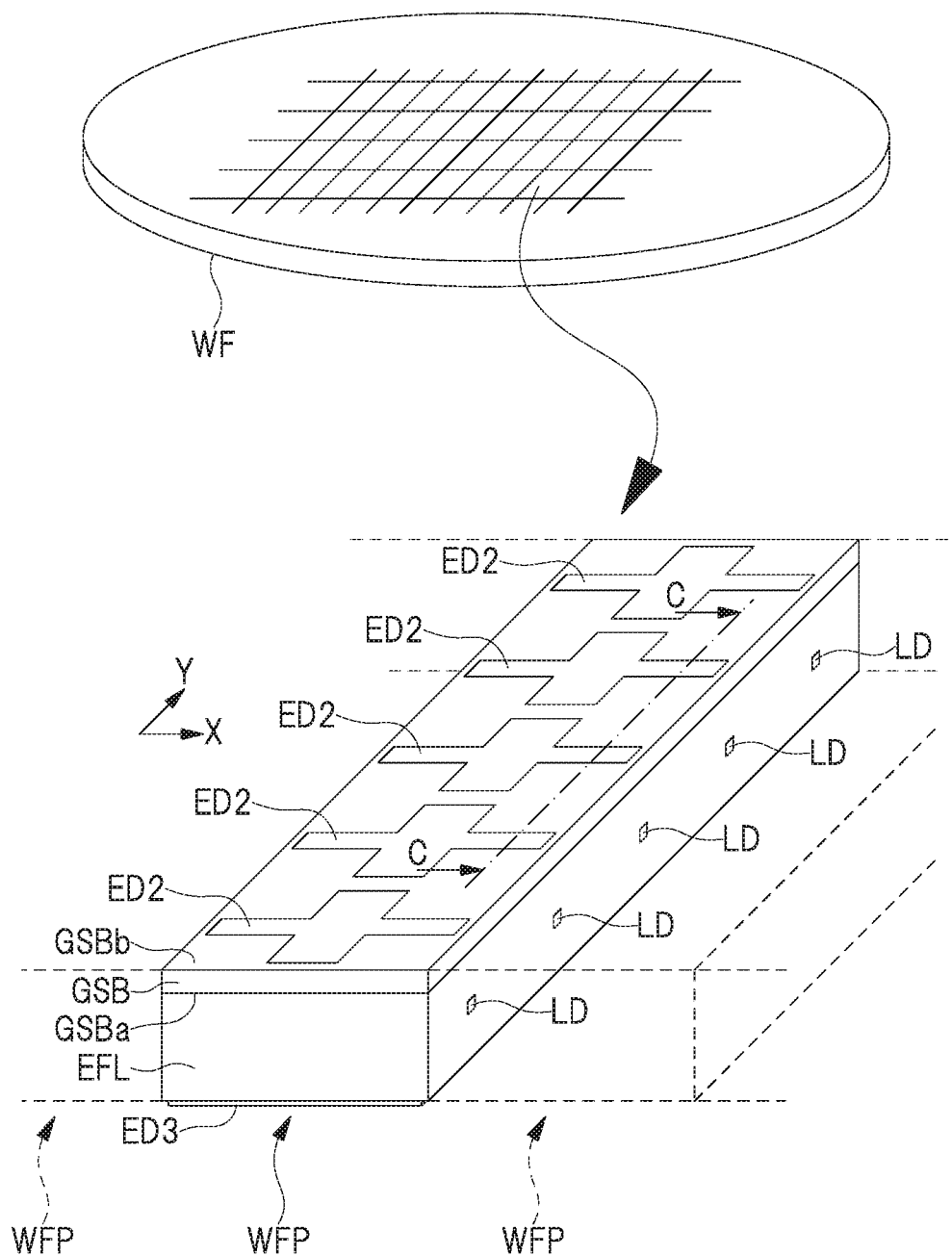
FIG. 19 is a perspective view showing a laser diode chip according to the first embodiment in a manufacturing process.
Figure 20:
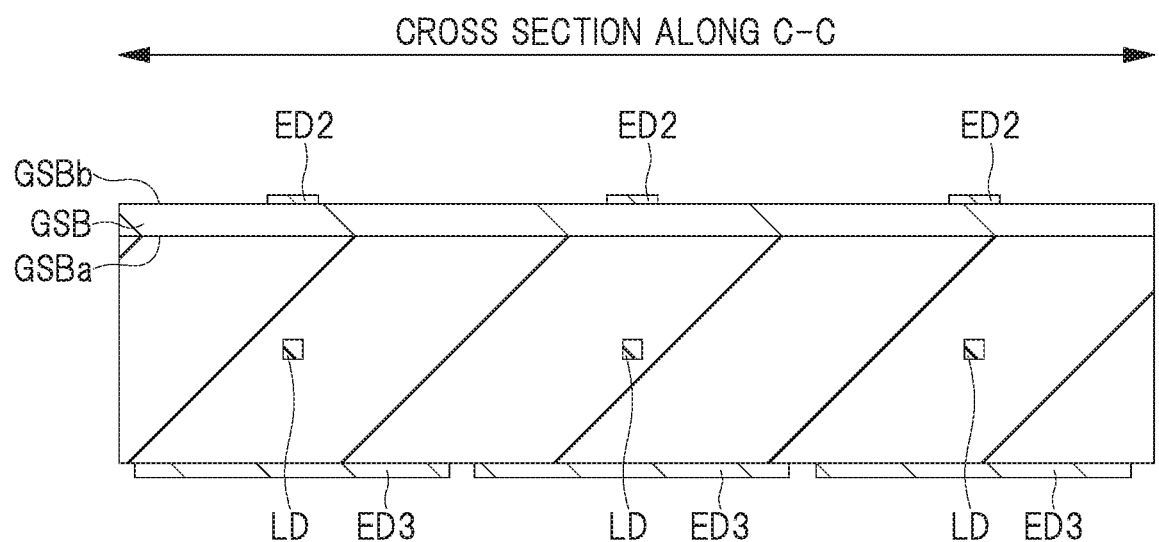
FIG. 20 is a cross-sectional view showing the laser diode chip according to the first embodiment in the manufacturing process.

FIG. 19 is a perspective view showing a structure of such a wafer WF, and FIG. 20 is a cross-sectional view taken along a line C-C of FIG. 19. FIG. 19 also shows an enlarged perspective view of a main portion of the wafer WF, and a wafer piece WFP is a portion of the wafer WF and represents a region to be separated in a step of cleaving described below.

In addition, the element forming layer EFL shown in FIG. 20 is constituted by a plurality of compound semiconductor layers such as $Ga_{1-x}Al_xAs$ layers, and $Ga_{1-y}Al_yAs$ layers (Y>X) serving as an active layer which is the light emitting unit LD of the laser beam (light) LB are formed in some of the compound semiconductor layers. Such a plurality of compound semiconductor layers can be sequentially formed by using, for example, the CVD process.

The electrode ED3 which is an upper electrode of the semiconductor chip CHP2 is formed by, for example, the sputtering method, and is a metal film containing, for example, gold (Au), nickel (Ni) or copper (Cu).

The electrode ED2 which is a lower electrode of the semiconductor chip CHP2 is formed by, for example, the sputtering method, and is constituted by a metal film containing, for example, gold (Au), nickel (Ni) or copper (Cu), and an alloy film made of the metal contained in this metal film and the material contained in the compound semiconductor substrate GSB.

Figure 21:
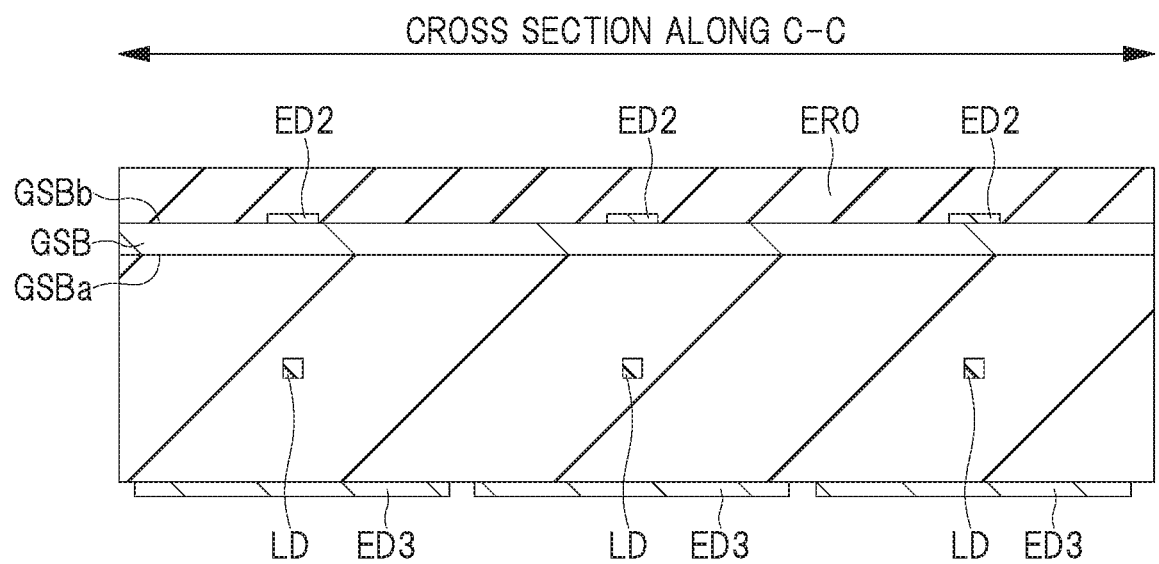
FIG. 21 is a cross-sectional view showing the laser diode chip according to the first embodiment in the manufacturing process continued from FIG. 20.

FIG. 21 shows a step of forming the permanent resist film ER0.

The permanent resist film ER0 is formed over the electrode ED2 and over the compound semiconductor substrate GSB at a position closer to the back surface GSBb of the compound semiconductor substrate GSB. The permanent resist film ER0 is a resin film that is the basis of the pedestal ER formed in the subsequent step.

The permanent resist film ER0 may have a photosensitive resin composition and adhesiveness. Examples of a liquid permanent resist material (permanent resist material to which the coating method is applied) include TMMR-S2000 manufactured by Tokyo Ohka Kogyo Co., Ltd. and KI-1000-T4 manufactured by Hitachi Chemical Company, Ltd.

Examples of the materials of such a permanent resist film ER0 include a photosensitive resin composition containing the following components A, B, C, D and E.

Component A: A photo-radical reactive resin having one or more units of an ethylene-based unsaturated group and a carboxyl group in one molecule Component B: A photo-polymerizable monomer having one or more units of an ethylene-based unsaturated group and a tricyclodecane structure Component C: A photo-polymerization initiator Component D: An epoxy resin Component E: A silica filler In addition, the permanent resist film ER0 can be formed by, for example, the coating method (spin coating method) and has a thickness of approximately 5 μm to 10 μm.

The coating method is a method in which a chemical solution which is a film forming material (here, the forming material for the permanent resist film ER0) is deposited and applied to the rotating wafer WF, and is a film forming method capable of forming a flat film. In addition, in the coating method, a thickness of the coated film can be easily adjusted by adjusting the rotation speed of the wafer WF. In this manner, the permanent resist film ER0 can be formed over the compound semiconductor substrate GSB.

The thickness of the permanent resist film ER0 can be determined according to a depth of the concave portion GR described with reference to FIG. 8. Namely, after the step of forming the concave portion GR of FIG. 8, a distance between a lower surface of the optical waveguide WO and the bottom surface of the concave portion GR is measured, and based on the measured result, the thickness of the permanent resist film ER0 can be adjusted such that the position of the light emitting unit LD is aligned with the position of the optical waveguide WO. In addition, since the permanent resist film ER0 is formed by the coating method as described above, the thickness of the permanent resist film ER0 can be easily adjusted, whereby flatness of the permanent resist film ER0 is easily ensured. Therefore, it is easy to precisely align the position of the light emitting unit LD and the position of the optical waveguide WO with each other.

Figure 22:
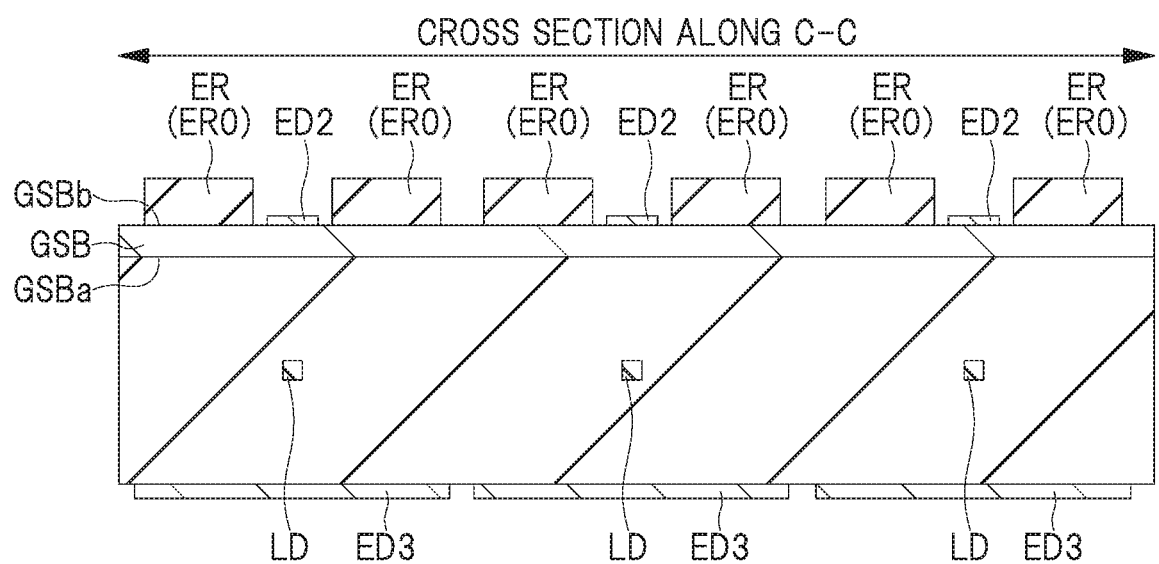
FIG. 22 is a cross-sectional view showing the laser diode chip according to the first embodiment in the manufacturing process continued from FIG. 21.

FIG. 22 shows a step of forming the pedestal ER.

After the permanent resist film ER0 is formed as described above, the permanent resist film ER0 is selectively subjected to an exposure process and a developing process to pattern the permanent resist film ER0. After the developing process, the permanent resist film ER0 is subjected to heat treatment (bake process). The heat treatment increases hardness of the permanent resist film ER0 such that the pedestal ER is formed. In this manner, the plurality of pedestals ER are formed on the compound semiconductor substrate GSB, and the electrodes ED2 are exposed between the pedestals ER. The pedestal ER is an insulating film and is more preferably an adhesive photosensitive resin film.

In addition, since the wafer piece WFP is singulated into a plurality of semiconductor chips CHP2 in the step of dicing described below, the pedestal ER is not formed in a boundary region between each of the semiconductor chips CHP2.

Here, an effect obtained by forming the pedestal ER by using the permanent resist film ER0 in the present embodiment will be described.

For example, in a technique in which a portion of the semiconductor substrate SB is etched to form the pedestal ER and in which the laser diode chip CHP2 is mounted on the pedestal ER as disclosed in the prior art document, alignment between the light emitting unit LD and the optical waveguide WO would depend on the etching precision of the semiconductor substrate SB. However, it would be difficult to precisely etch the semiconductor substrate SB such that the thickness of the pedestal ER is approximately 5 μm to 10 μm as in the present embodiment. In particular, since the semiconductor substrate SB is not provided with a film that serves as an etching stopper film, etching of the semiconductor substrate SB would need to be time-controlled. This makes it difficult to precisely etch and obtain a thickness of approximately 5 μm to 10 μm. Further, since there are regions that become the plurality of semiconductor chips CHP1 in the same wafer, it would be difficult to adjust the etching amount within the same wafer.

Thus, in a case where the pedestal ER is formed by etching the semiconductor substrate SB, a variation of approximately 10% or more with respect to the set value occurs. Depending on conditions, this variation may be approximately 20% to 30% with respect to the set value. Therefore, in the technique disclosed in the prior art document, when the thickness of the pedestal ER is not suitable for alignment between the light emitting unit LD and the optical waveguide WO, the semiconductor chip CHP1 would need to be replaced with another semiconductor chip CHP1 and alignment between the light emitting unit LD and the optical waveguide WO would need to be performed again, making this process very inefficient.

In this regard, alignment between the light emitting unit LD and the optical waveguide WO in the present embodiment can be performed by adjusting the thickness of the pedestal ER made of a material that differs from those of the semiconductor substrate SB and the compound semiconductor substrate GSB. Therefore, for example, even if small variations occur in the depth of the concave portion GR formed by etching the semiconductor substrate SB of the semiconductor chip CHP1, the thickness of the permanent resist film ER0 (the thickness of the pedestal ER) can be adjusted based on the measured result of the distance between the lower surface of the optical waveguide WO and the bottom surface of the concave portion GR measured after the step of forming the concave portion GR. Namely, alignment between the light emitting unit LD and the optical waveguide WO would not depend on the etching precision of the semiconductor substrate SB. Thus, as described above, the thickness of the permanent resist film ER0 can be easily controlled to a desired thickness. For example, variations in thickness of the permanent resist film ER0 formed in the present embodiment can be controlled within the range of 3% from the set value.

Thus, in the present embodiment, the light emitting unit LD and the optical waveguide WO can be precisely aligned with each other with no need to replace the semiconductor chip CHP1 or the like, whereby the semiconductor module can be highly efficiently formed as compared to the technique disclosed in the prior art document. Therefore, in the present embodiment, performance of the semiconductor device can be enhanced and manufacturing costs can be suppressed as compared to the prior art document.

Figure 23:
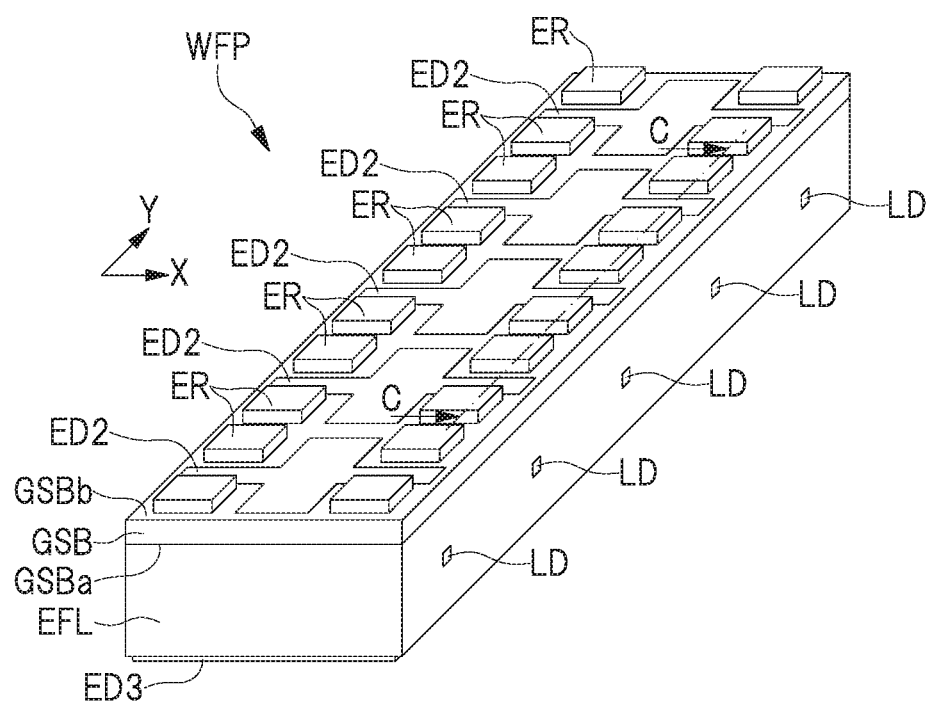
FIG. 23 is a perspective view showing the laser diode chip according to the first embodiment in the manufacturing process continued from FIG. 22.

FIG. 23 shows the semiconductor chip CHP2 in the manufacturing process continued from FIG. 22 and shows a step of cleaving the wafer WF.

First, the wafer WF constituted by the compound semiconductor substrate GSB is processed into a rectangle. Next, a scratch serving as a starting point of the cleaving is formed by using a diamond cutter or the like, and then, pressure is applied to the wafer WF to separate the wafer WF into a plurality of wafer pieces WFP. The wafer piece WFP is a bar-like piece on which five semiconductor chips CHP2 are formed. Note that the number of semiconductor chips CHP2 formed on the wafer piece WFP can be changed accordingly. In addition, this step of cleaving allows end surfaces of the plurality of light emitting unit LD to be exposed through both side surfaces of the wafer piece WFP.

Figure 24:
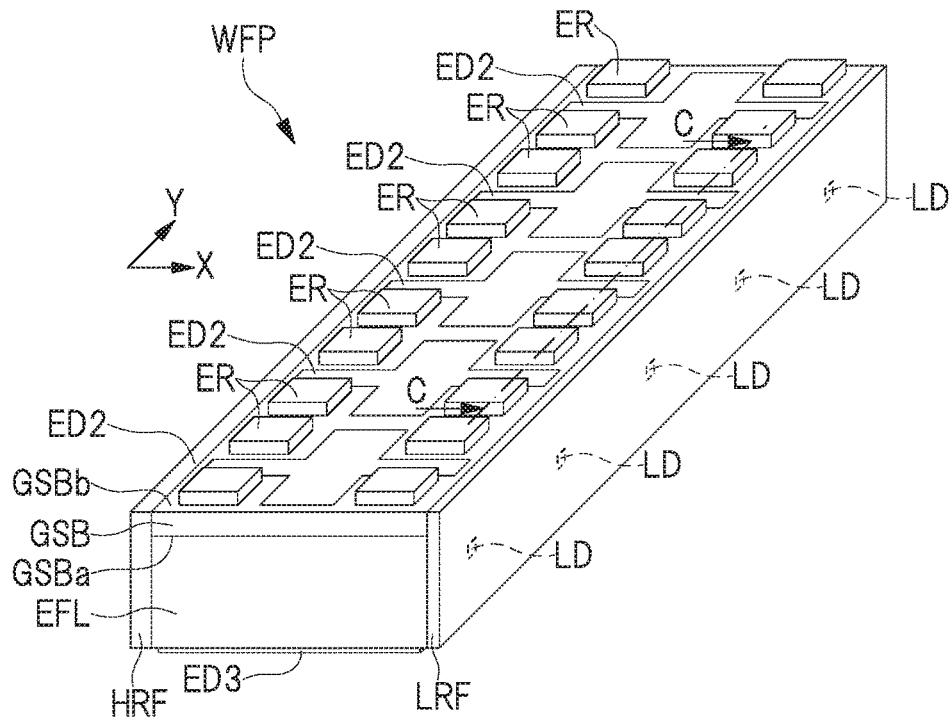
FIG. 24 is a perspective view showing the laser diode chip according to the first embodiment in the manufacturing process continued from FIG. 23.

FIG. 24 shows a step of forming the low reflection film LRF and the high reflection film HRF.

First, a protective film having a pattern such that one side surface of the wafer piece WFP is exposed and other regions of the wafer piece WFP are covered is formed. The protective film is a film such as a resist pattern, a copper plate or the like that functions as a mask. Next, the low reflection film LRF is formed over one side surface of the wafer piece WFP by the CVD process with using the protective film as a mask. Next, the high reflection film HRF is formed over the other side surface of the wafer piece WFP using the same process.

In this manner, one end surface of each of the light emitting units LD exposed through the side surface of the wafer piece WFP is covered by the low reflection film LRF while the other end surface of each of the light emitting units LD is covered by the high reflection film HRF.

The low reflection film LRF is a single layer film constituted by, for example, a silicon nitride film, a silicon oxynitride film or an aluminum oxide film. The high reflection film HRF is a stacked film constituted by, for example, a silicon nitride film, a silicon oxynitride film, a silicon oxide film or an aluminum oxide film, and has a thickness that is greater than the low reflection film LRF. A thickness of the low reflection film LRF is approximately 50 nm while the thickness of the high reflection film HRF is approximately 100 nm.

Figure 25:
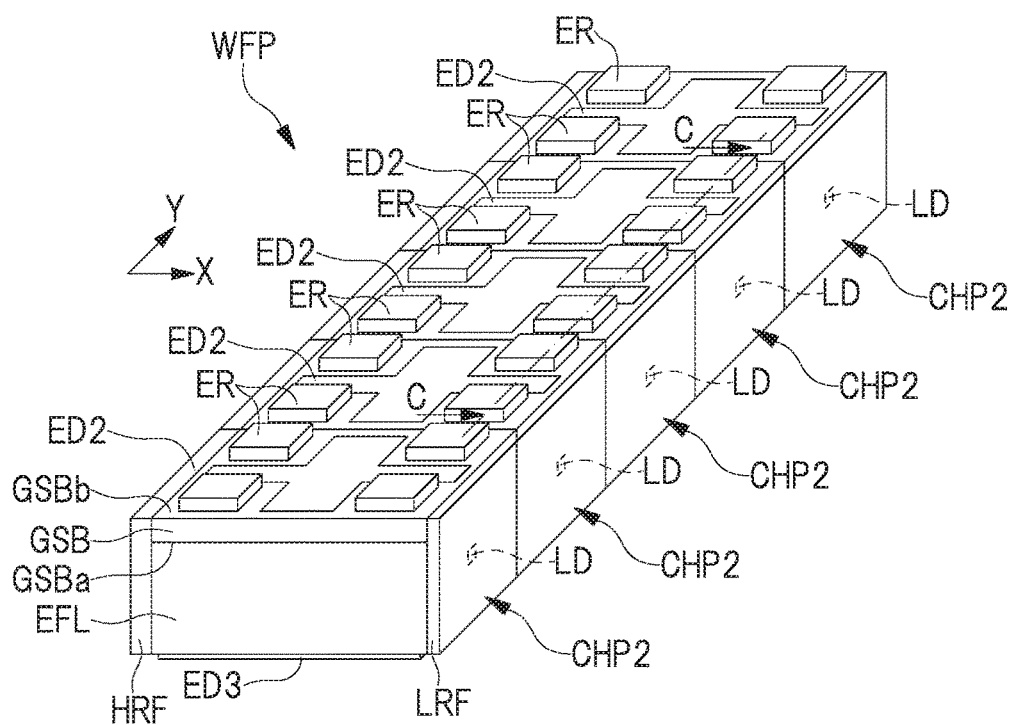
FIG. 25 is a perspective view showing the laser diode chip according to the first embodiment in the manufacturing process continued from FIG. 24.
Figure 26:
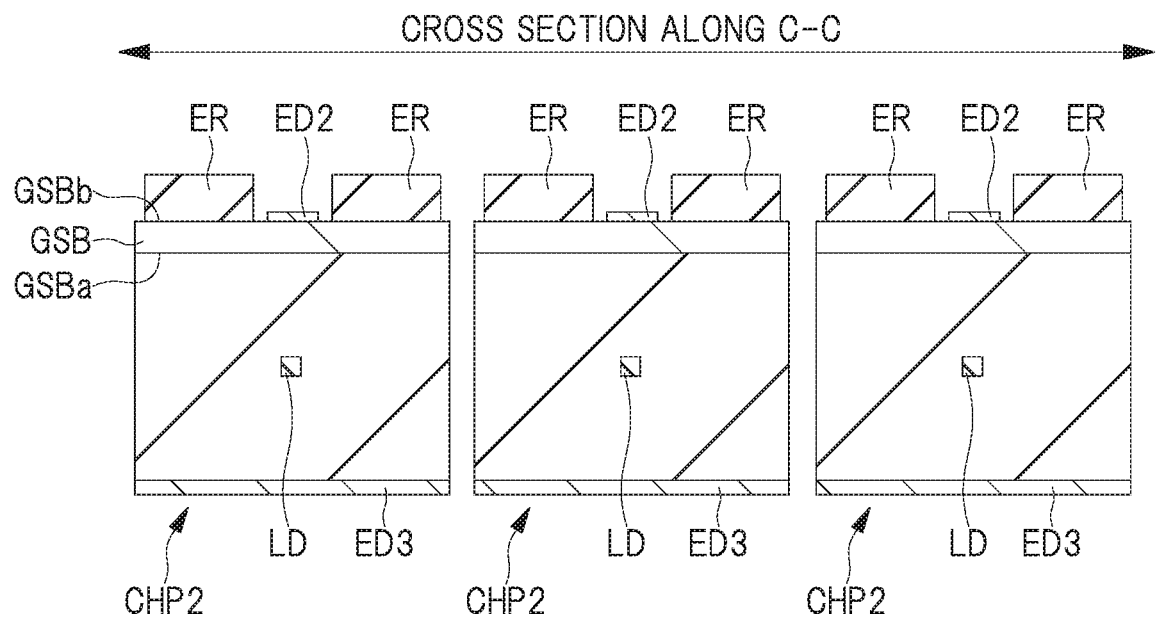
FIG. 26 is a cross-sectional view showing the laser diode chip according to the first embodiment in the manufacturing process continued from FIG. 24.

FIGS. 25 and 26 show the step of dicing.

FIG. 25 is a perspective view showing the semiconductor chip CHP2 in the manufacturing process continued from FIG. 24, and FIG. 26 is a cross-sectional view taken along a line C-C of FIG. 25.

First, an adhesive tape is adhered to a surface of the wafer piece WFP on which the electrode ED3 is formed. Next, a scratch is formed in the wafer piece WFP by using a diamond cutter or the like, and then, the tape is stretched to separate the wafer piece WFP into a plurality of semiconductor chips CHP2. Next, the tape is separated while the side surface of the semiconductor chip CHP2 is scraped by using a dicer or the like. Thereafter, the tape is removed from the semiconductor chip CHP2.

FIG. 27 is a drawing showing the semiconductor chip CHP2 in the manufacturing process continued from FIGS. 25 and 26. FIG. 27 shows the surface of the semiconductor chip CHP2 opposite to the surface shown in FIG. 1, and is a plan view as seen from a side of the electrode ED2 which is a backside electrode. In FIG. 27, the lines A-A and B-B are shown for the sake of easily understanding correspondence with FIG. 1. Therefore, descriptions of the semiconductor chip CHP2 with reference to the cross-sectional views taken along the lines A-A and B-B and of the plan view are the same as those described with reference to FIGS. 1 to 3 and will be omitted here.

In this manner, the semiconductor chip CHP2 partially configuring the semiconductor device of the present embodiment is manufactured.

Manufacturing Method of Semiconductor Module Comprising Semiconductor Chip CHP1 and Semiconductor Chip CHP2

Figure 28:
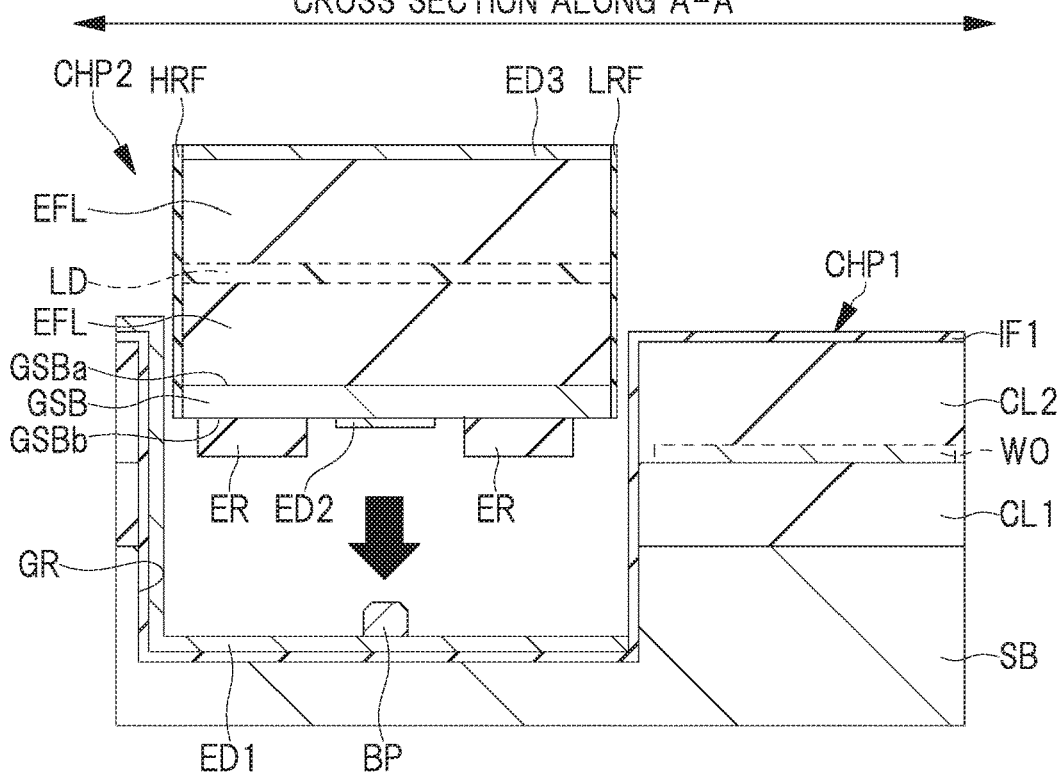
FIG. 28 is a cross-sectional view showing a semiconductor module according to the first embodiment in a manufacturing process.

A manufacturing method of the semiconductor module according to the present embodiment will be described with reference to FIGS. 1, 28 and 29. FIG. 28 is a cross-sectional view taken along the line A-A of FIG. 1, and FIG. 29 is a cross-sectional view taken along the line B-B of FIG. 1.

Figure 29:
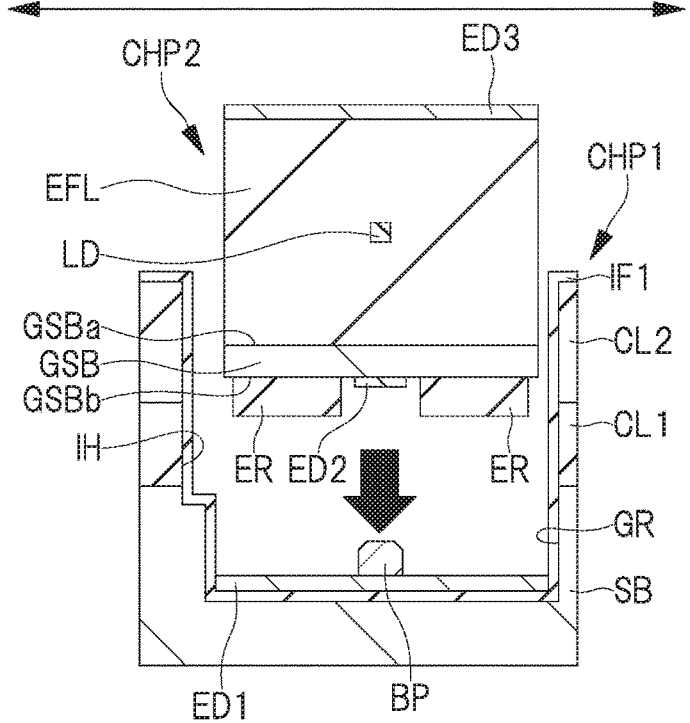
FIG. 29 is a cross-sectional view showing the semiconductor module according to the first embodiment in the manufacturing process.

FIGS. 28 and 29 show a step of mounting the semiconductor chip CHP2 manufactured as described above on the semiconductor chip CHP1 manufactured as described above.

First, as described above with reference to FIGS. 21 and 22, the depth of the concave portion GR of the semiconductor chip CHP1 is measured. Specifically, the distance between the lower surface of the optical waveguide WO and the bottom surface of the concave portion GR is measured. Next, based on the measured result, the thickness of the permanent resist film ER0 of the semiconductor chip CHP2 is adjusted such that the position of the light emitting unit LD is aligned with the position of the optical waveguide WO to form the pedestal ER constituted by the permanent resist film ER0 on the semiconductor chip CHP2.

Next, the bump electrode BP constituted by a conductive film made of, for example, solder or the like is formed on the electrode ED1 that is formed on the bottom surface of the concave portion GR of the semiconductor chip CHP1. As shown in FIG. 1, in the present embodiment, five bump electrodes BP are formed on the electrode ED1, and each of the bump electrodes BP is formed at a position not overlapping the pedestal ER in plan view.

Next, as indicated by arrows in FIGS. 28 and 29, the semiconductor chip CHP2 is mounted in the concave portion GR of the semiconductor chip CHP1. Thus, the electrode ED2 of the semiconductor chip CHP2 is electrically connected to the electrode ED1 of the semiconductor chip CHP1 via the bump electrode BP. At this time, since the thickness of the pedestal ER has already been adjusted as described above, the position of the light emitting unit LD and the position of the optical waveguide WO are aligned with each other with relatively high precision. Namely, at this stage, precision of alignment in the present embodiment is already higher than precision of alignment in the prior art document.

Next, a resin film to which a silica filler is added is injected through the injection hole IH of the semiconductor chip CHP1 to temporarily fix the position of the pedestal ER. Such a resin film partially configures the sealing material MR formed in a later step and is made integral with the sealing material MR.

Next, a bonding wire WB is bonded to the electrode ED3 of the semiconductor chip CHP2. In this state, a potential can be supplied from the outside of the semiconductor chip CHP2, thereby allowing a current to flow in the semiconductor chip CHP2 to emit the laser beam LB from the light emitting unit LD. Note that illustrations of the bonding wire WB are omitted from FIGS. 28 and 29.

Next, alignment in the Y direction is performed while emitting the laser beam LB from the light emitting unit LD. Alignment of the semiconductor chip CHP2 is performed while allowing the laser beam LB from the semiconductor chip CHP2 to enter the optical waveguide WO, receiving the laser beam LB by a test light receiver (not shown) formed at an end portion of the optical waveguide WO and monitoring the receiving amount of the laser beam LB. More specifically, the semiconductor chip CHP2 is gradually moved in the Y direction of FIG. 1 in a state in which the high reflection film HRF of the semiconductor chip CHP2 is in contact with the insulating film IF1 formed over the side surface of the concave portion GR. When the semiconductor chip CHP2 reaches a position where the amount of the laser beam LB received by the optical waveguide WO is at a maximum (local maximum) value, movement of the semiconductor chip CHP2 is stopped. Thus, the end surface (exit surface) of the light emitting unit LD is arranged so as to face the end surface (incident surface) of the optical waveguide WO.

As another alignment method in the Y direction, the semiconductor chip CHP2 may be gradually moved in the Y direction of FIG. 1 in a state in which the low reflection film LRF of the semiconductor chip CHP2 is in contact with the insulating film IF1 formed over the side surface of the concave portion GR. When the semiconductor chip CHP2 reaches a position where the amount of the laser beam LB received by the optical waveguide WO is at the maximum value, movement of the semiconductor chip CHP2 is stopped.

Further, the aligning method of the optical axes is not limited to the above-described method in which a relative position of the semiconductor chip CHP2 is adjusted with respect to the semiconductor chip CHP1 while monitoring the amount of the laser beam LB. For example, a structure for alignment may be provided in advance on each of the surfaces of the concave portion GR and semiconductor chip CHP2 facing each other. Accordingly, by only arranging the semiconductor chip CHP2 in the concave portion GR of the semiconductor chip CHP1, the optical axes can be aligned based on the above-described structures for alignment. As a result, manufacturing costs of the semiconductor device can be reduced.

Next, a resin film to which a silica filler is added and serving as the sealing material MR is injected through the injection hole IH formed in the side surface of the concave portion GR of the semiconductor chip CHP1, and then is subjected to heat treatment at approximately 200° C. to 300° C. to cure the sealing material MR. As described above, the sealing material MR is a thermosetting resin film. Thus, the semiconductor chip CHP2 is fixed in the concave portion GR.

The sealing material MR only needs to be sufficiently injected into the concave portion GR. As described above, there may be a case where no injection hole IH is formed in the semiconductor chip CHP1. In this case, for example, dimensions of the concave portion GR are set to be sufficiently larger than those of the semiconductor chip CHP2, whereby the sealing material MR can be sufficiently injected into the concave portion GR.

In the present embodiment, a case where the sealing material MR is filled to a position lower than the optical waveguide WO such that the sealing material MR is not formed between the light emitting unit LD and the optical waveguide WO is described by way of example. Namely, the sealing material MR is formed in the concave portion GR so as to be in contact with at least a portion of the pedestal ER and be located at a lower position than the optical waveguide WO and the light emitting unit LD.

In this manner, the semiconductor module that includes the semiconductor chip CHP1 and the semiconductor chip CHP2 as shown in FIGS. 1 to 3 and is a form of the semiconductor device of the present embodiment is manufactured.

First Modification Example

Figure 30:
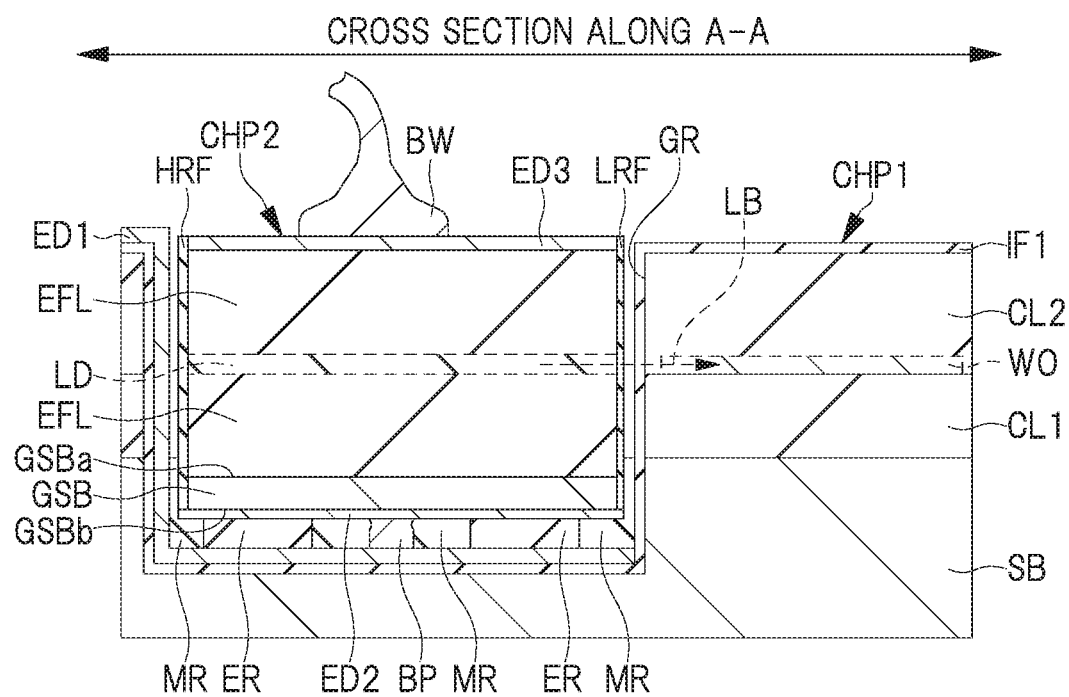
FIG. 30 is a cross-sectional view showing a semiconductor device according to a first modification example of the first embodiment.

Hereinafter, a semiconductor device according to a first modification example of the first embodiment will be described with reference to FIG. 30. Note that differences from the first embodiment will be mainly described below. FIG. 30 is a cross-sectional view corresponding to FIG. 2 taken along the line A-A of FIG. 1.

As shown in FIGS. 1 to 3, in the first embodiment, the electrode ED2 which is a lower electrode of the semiconductor chip CHP2 is not formed in the region in which the pedestal ER is formed.

As shown in FIG. 30, in the first modification example, the electrode ED2 is formed over most of the back surface GSBb of the compound semiconductor substrate GSB. In addition, the pedestal ER is adhered to the electrode ED2. In other words, the pedestal ER is arranged at a position overlapping the electrode ED2 in plan view. The same effects as in the first embodiment can be obtained in the first modification example.

Second Modification Example

Figure 31:
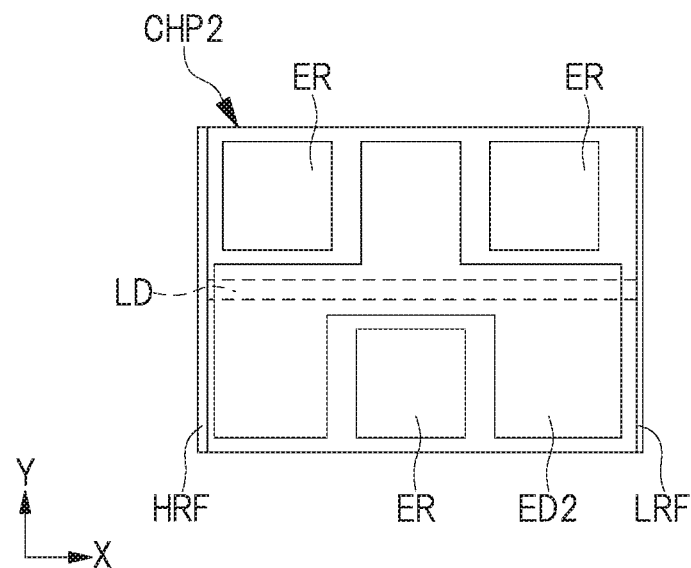
FIG. 31 is a plan view showing a semiconductor device according to a second modification example of the first embodiment.

Hereinafter, a semiconductor device according to a second modification example of the first embodiment will be described with reference to FIG. 31. Note that differences from the first embodiment will be mainly described below. FIG. 31 is a plan view of the semiconductor chip CHP2 corresponding to FIG. 27.

As shown in FIG. 27, four pedestals ER are arranged in the first embodiment. However, the number of pedestals may be three or more as shown in FIG. 31, where three pedestals ER are arranged.

In the second modification example, each of the three pedestals ER are arranged such that, when virtual lines connecting the centers of the three pedestals ER in plan view are drawn as in the first embodiment, a triangular shape is formed by these virtual lines.

In addition, in plan view of the semiconductor chip CHP2, one or more pedestals ER are arranged at positions closer to one of the two sides opposite to each other in the X direction than to the first center line connecting center points of the two sides opposite to each other in the Y direction, and one or more pedestals ER are arranged at positions closer to the other of the two sides than to the first center line. From the same viewpoint, in plan view of the semiconductor chip CHP2, one or more pedestals ER are arranged at positions closer to one of the two sides opposite to each other in the X direction than to the second center line connecting center points of the two sides opposite to each other in the Y direction, and one or more pedestals ER are arranged at positions closer to the other of the two sides than to the second center line.

By arranging the pedestals ER as described above, the semiconductor chip CHP2 can be stably mounted on the semiconductor chip CHP1.

In addition, the technique of the second modification example can be combined and applied to the above-described first modification example.

Third Modification Example

Figure 32:
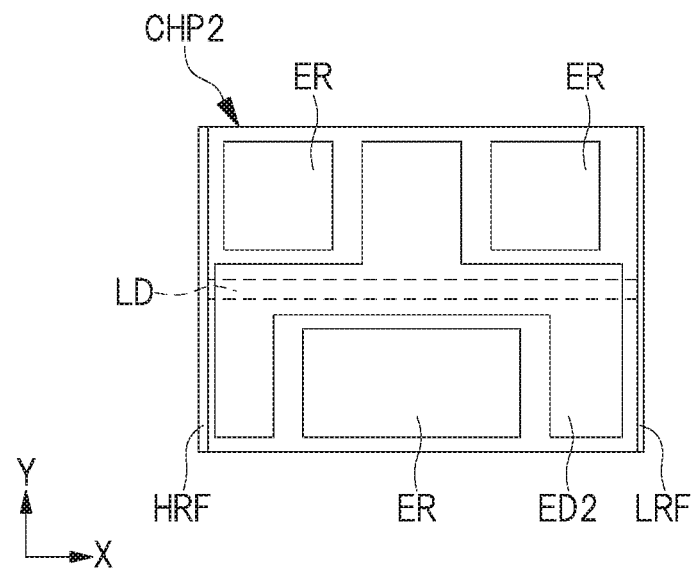
FIG. 32 is a plan view showing a semiconductor device according to a third modification example of the first embodiment.

Hereinafter, a semiconductor device according to a third modification example of the first embodiment will be described with reference to FIG. 32. Note that differences from the second modification example will be mainly described below. FIG. 32 is a plan view of the semiconductor chip CHP2 corresponding to FIG. 27.

As shown in FIG. 32, in the third modification example, three pedestals ER are arranged as in the second modification example. The sizes and shapes of the pedestals ER may be the same as one another or may differ from one another.

In the second modification example, the planar shape of each of the three pedestals ER is the same. However, in the third modification example, the size of one pedestal ER arranged at a position closer to the other of the two sides of the semiconductor chip CHP2 is larger than the size of the other two pedestals ER. Specifically, the planar shape of the one pedestal ER is a rectangle having a length in the X direction that is longer than a length in the Y direction. Therefore, a planar area of the one pedestal ER is greater than a planar area of each of the other two pedestals ER and is approximately twice the planar area of each of the other two pedestals ER.

Thus, a total planar area of the two pedestals ER arranged at positions closer to one of the two sides of the semiconductor chip CHP2 opposite to each other in the Y direction is substantially equal to the planar area of the one pedestal ER arranged at the position closer to the other of the two sides of the semiconductor chip CHP2, whereby the balance of the flipped semiconductor chip CHP2 is improved at the time of mounting the semiconductor chip CHP2 on the semiconductor chip CHP1.

Namely, when the number of pedestals ER arranged at positions closer to one of the two sides of the semiconductor chip CHP2 and the number of pedestals ER arranged at positions closer to the other of the two sides of the semiconductor chip CHP2 differ from each other, the planar area of the pedestal ER among the fewer number of pedestals is made to be greater than the planar area of the pedestal ER among the larger number of pedestals. In this manner, the semiconductor chip CHP2 can be mounted more stably on the semiconductor chip CHP1.

The third modification example has described a case where three pedestals ER are arranged. However, the pedestal ER having the greater planar area can also be applied to a case where four pedestals ER are arranged as in the first embodiment. In this case, the planar area of each of the pedestals ER having the greater planar area allows an increase in a contact area between each of the pedestals ER and the semiconductor chip CHP1, whereby the semiconductor chip CHP2 can be mounted more stably on the semiconductor chip CHP1.

Fourth Modification Example

Figure 33:
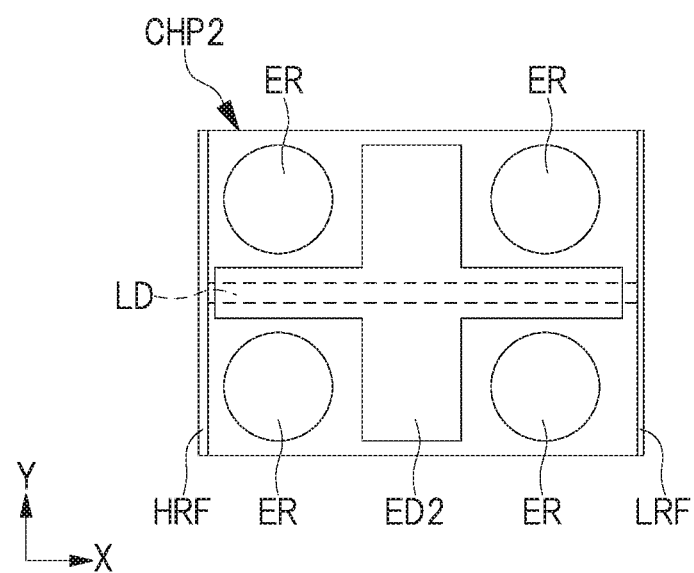
FIG. 33 is a plan view showing a semiconductor device according to a fourth modification example of the first embodiment.

Hereinafter, a semiconductor device according to a fourth modification example of the first embodiment will be described with reference to FIG. 33. Note that differences from the first embodiment will be mainly described below. FIG. 33 is a plan view of the semiconductor chip CHP2 corresponding to FIG. 27.

As shown in FIG. 33, the planar shape of each of the pedestals ER in the fourth modification example is a circle, or a perfect circle.

As described above with reference to FIGS. 28 and 29, a step of gradually moving the semiconductor chip CHP2 in the Y direction is performed when aligning the light emitting unit LD and the optical waveguide WO with each other. At this time, when the planar shape of each of the pedestals ER is a circle, the semiconductor chip CHP2 can be easily moved as compared to a case where the planar shape of each of the pedestals ER is a quadrangle (polygon). Therefore, the time required to align the light emitting unit LD and the optical waveguide WO with each other can be shortened, whereby the time (TAT: Turn Around Time) required for the manufacturing process can be shortened.

In addition, the technique of the fourth modification example can be combined and applied to the above-described first to third modification examples.

Fifth Modification Example

Figure 34:
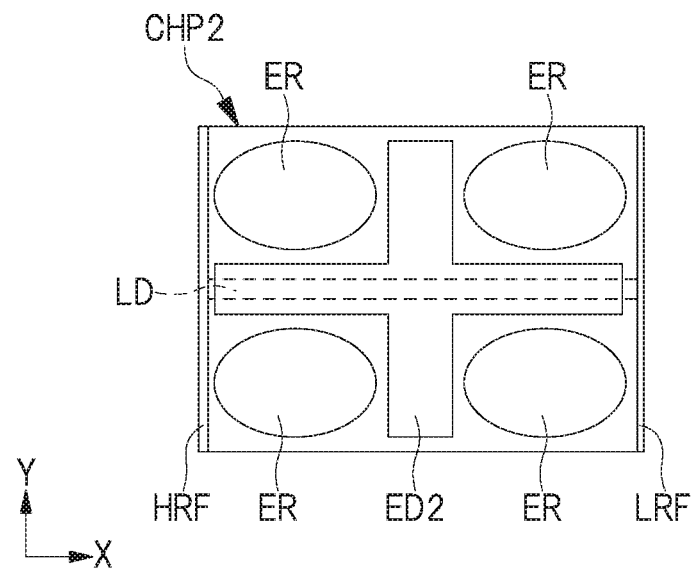
FIG. 34 is a plan view showing a semiconductor device according to a fifth modification example of the first embodiment.

Hereinafter, a semiconductor device according to a fifth modification example of the first embodiment will be described with reference to FIG. 34. Note that differences from the fourth modification example will be mainly described below. FIG. 34 is a plan view of the semiconductor chip CHP2 corresponding to FIG. 27.

As shown in FIG. 34, the planar shape of each of the pedestals ER in the fifth modification example is an ellipse. Thus, in the fifth modification example, the semiconductor chip CHP2 can be easily moved when aligning the light emitting unit LD and the optical waveguide WO with each other as in the fourth modification example. Therefore, the same effects as in the fourth modification example can be obtained in the fifth modification example.

In addition, the planar area of each of the pedestals ER of the fifth modification example is greater than the planar area of each of the pedestals ER of the fourth modification example. Therefore, the contact area between each of the pedestals ER and the semiconductor chip CHP1 can be increased, whereby the semiconductor chip CHP2 can be mounted more stably on the semiconductor chip CHP1.

Sixth Modification Example

Figure 35:
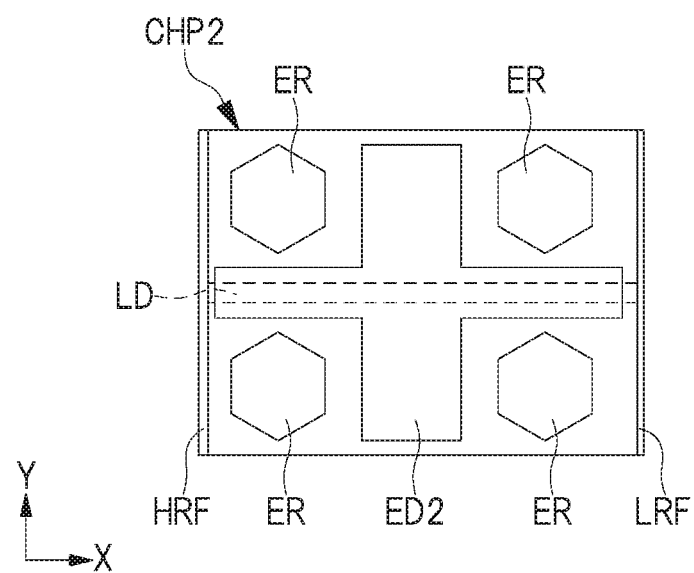
FIG. 35 is a plan view showing a semiconductor device according to a sixth modification example of the first embodiment.

Hereinafter, a semiconductor device according to a sixth modification example of the first embodiment will be described with reference to FIG. 35. Note that differences from the first embodiment will be mainly described below. FIG. 35 is a plan view of the semiconductor chip CHP2 corresponding to FIG. 27.

The planar shape of the pedestal ER may be a polygon and is, for example, preferably a regular hexagon. As shown in FIG. 35, the planar shape of each of the pedestals ER in the sixth modification example is a regular hexagon. The regular hexagon has a high durability against external pressure. Therefore, in a case where, for example, the semiconductor chip CHP2 is moved when aligning the light emitting unit LD and the optical waveguide WO with each other, damage to each of the pedestals ER caused by friction can be minimized.

In addition, the technique of the sixth modification example can be combined and applied to the above-described first to third modification examples.

In the foregoing, the invention made by the present inventors has been concretely described based on the embodiment. However, the present invention is not limited to the foregoing embodiment, and various modifications can be made within the scope of the present invention.

What is claimed is:

1. A semiconductor device comprising:
   a first semiconductor chip that includes:
     a first substrate;
     an insulating layer formed on an upper surface of the first substrate;
     an optical waveguide formed on the insulating layer;
     an interlayer insulating film formed over the insulating layer so as to cover the optical waveguide; and
     a concave portion formed in a region of the first substrate different from a region in which the optical waveguide is formed,
     wherein the concave portion penetrates into the first substrate through the interlayer insulating film and the insulating layer; and
   a second semiconductor chip that includes a second substrate, and a light emitting unit formed on an upper surface of the second substrate and emitting a light toward the optical waveguide,
   wherein the second semiconductor chip is mounted in the concave portion, and
   wherein a pedestal which is an insulating film is formed between a bottom surface of the concave portion and a back surface of the second substrate, the back surface being a surface opposite to the upper surface of the second substrate.

2. The semiconductor device according to claim 1,
   wherein the optical waveguide extends in a first direction in plan view and includes a first end surface in the first direction,
   the light emitting unit extends in the first direction in plan view and includes a second end surface in the first direction, and
   the second end surface of the light emitting unit faces the first end surface of the optical waveguide.

3. The semiconductor device according to claim 1,
   wherein a first electrode is formed on the bottom surface of the concave portion,
   a second electrode is formed on the back surface of the second substrate,
   the first electrode is electrically connected to the second electrode via a bump electrode, and
   the bump electrode is formed at a position not overlapping the pedestal in plan view.

4. The semiconductor device according to claim 3,
   wherein the pedestal is adhered to the second electrode.

5. The semiconductor device according to claim 1,
   wherein three or more pedestals are formed.

6. The semiconductor device according to claim 5,
   wherein, when three or more virtual lines connecting each center of the three or more pedestals to one another in plan view are drawn, a polygonal shape is formed by the three or more virtual lines.

7. The semiconductor device according to claim 6,
   wherein the second semiconductor chip includes a first side and a second side opposite to each other in a first direction in plan view, and a third side and a fourth side opposite to each other in a second direction orthogonal to the first direction in plan view, and
   wherein one or more pedestals are arranged at positions closer to the first side than to a first center line connecting a center point of the third side and a center point of the fourth side to each other in plan view, and one or more pedestals are arranged at positions closer to the second side than to the first center line in plan view.

8. The semiconductor device according to claim 7,
   wherein one or more pedestals are arranged at positions closer to the third side than to a second center line connecting a center point of the first side and a center point of the second side to each other in plan view, and one or more pedestals are arranged at positions closer to the fourth side than to the second center line in plan view.

9. The semiconductor device according to claim 7,
   wherein, when the number of pedestals arranged at positions closer to the first side than to the first center line in plan view and the number of pedestals arranged at positions closer to the second side than to the first center line in plan view differ from each other, a planar area of the pedestal among the fewer number of pedestals is greater than a planar area of the pedestal among the larger number of pedestals.

10. The semiconductor device according to claim 5, wherein a planar shape of each of the three or more pedestals is a circle or an ellipse.

11. The semiconductor device according to claim 5, wherein a planar shape of each of the three or more pedestals is a regular hexagon.

* * * * *